(12) United States Patent
Bentley et al.

(10) Patent No.: US 10,298,272 B2
(45) Date of Patent: *May 21, 2019

(54) POST-DECODING ERROR CHECK WITH DIAGNOSTICS FOR PRODUCT CODES

(71) Applicant: International Business Machines Corporation, Armonk, NY (US)

(72) Inventors: Steven R. Bentley, Tucson, AZ (US); Roy D. Cideciyan, Rueschlikon (CH); Robert A. Hutchins, Tucson, AZ (US); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 194 days.

This patent is subject to a terminal disclaimer.

(21) Appl. No.: 15/181,200

(22) Filed: Jun. 13, 2016

(65) Prior Publication Data

US 2017/0170849 A1 Jun. 15, 2017

Related U.S. Application Data

(63) Continuation of application No. 14/968,726, filed on Dec. 14, 2015, now Pat. No. 9,413,392.

(51) Int. Cl.
*H03M 13/29* (2006.01)
*H03M 13/37* (2006.01)
(Continued)

(52) U.S. Cl.
CPC ....... *H03M 13/2909* (2013.01); *H03M 13/29* (2013.01); *H03M 13/2927* (2013.01);
(Continued)

(58) Field of Classification Search
CPC .. H03M 13/2909; H03M 13/29; H03M 13/25; H03M 13/2948; H03M 13/613;
(Continued)

(56) References Cited

U.S. PATENT DOCUMENTS 4,104,735 A   8/1978 Hofmann et al.
5,684,810 A   11/1997 Nakamura et al.
(Continued)

FOREIGN PATENT DOCUMENTS

CN    1122025 A    5/1996

OTHER PUBLICATIONS

International Search Report and Written Opinion from PCT Application No. PCT/IB2016/057180, dated Mar. 1, 2017.
(Continued)

*Primary Examiner* — Shelly A Chase
(74) *Attorney, Agent, or Firm* — Zilka-Kotab, P.C.

(57) ABSTRACT

In one embodiment, a system includes a controller and logic integrated with and/or executable by the controller. The logic is configured to perform iterative decoding on encoded data to obtain decoded data. The logic is also configured to perform post-decoding error diagnostics on a first portion of the decoded data in response to not obtaining a valid product codeword in the first portion after the iterative decoding of the encoded data. Other systems, methods, and computer program products for producing post-decoding error signatures are presented in accordance with more embodiments.

20 Claims, 22 Drawing Sheets

(51) Int. Cl.
*H03M 13/00* (2006.01)
*H03M 13/15* (2006.01)

(52) U.S. Cl.
CPC ... *H03M 13/2948* (2013.01); *H03M 13/3738* (2013.01); *H03M 13/613* (2013.01); *H03M 13/1515* (2013.01)

(58) Field of Classification Search
CPC ......... H03M 13/2927; H03M 13/3738; H03M 13/09
See application file for complete search history.

(56) References Cited

U.S. PATENT DOCUMENTS

| | | | |
|---|---|---|---|
| 6,898,754 B2 * | 5/2005 | Paterson | G11B 20/1833 714/755 |
| 7,069,496 B2 | 6/2006 | Fujita et al. | |
| 8,467,249 B2 | 6/2013 | Katz et al. | |
| 8,566,672 B2 | 10/2013 | Moyer et al. | |
| 8,806,295 B2 | 8/2014 | Jagmohan et al. | |
| 9,413,392 B1 | 8/2016 | Bentley et al. | |
| 2003/0126546 A1 | 7/2003 | Fujita et al. | |
| 2008/0298334 A1 * | 12/2008 | Arviv | H04L 1/0048 370/341 |
| 2010/0293432 A1 | 11/2010 | Miyata et al. | |
| 2011/0158333 A1 * | 6/2011 | Nakano | H03M 13/25 375/259 |
| 2013/0151920 A1 * | 6/2013 | Mayrench | H04L 1/0053 714/748 |

OTHER PUBLICATIONS

Bentley et al., U.S. Appl. No. 14/968,726, filed Dec. 14, 2015.
List of IBM Patents or Patent Applications Treated as Related, Jun. 13, 2016.
Cideciyan et al., U.S. Appl. No. 14/328,510, filed Jul. 10, 2014.
Bentley, S. R. et al., U.S. Appl. No. 15/013,821, dated Feb. 2, 2016.
Notice of Allowance from U.S. Appl. No. 14/968,726, dated May 6, 2016.
Zhi et al., "FPGA implementation of a modified hard decision decoding for 2-D TPC," IEEE, 2009, pp. 225-228.
Al-Shaikhi et al., "Modified algorithm for hard decision decoding of product codes," IEEE, Communications Society, 2004, pp. 1760 to 1763.
Examination Report from European Application No. GB1803554.3, dated Oct. 8, 2018.

* cited by examiner

POST-DECODING ERROR CHECK WITH DIAGNOSTICS FOR PRODUCT CODES

BACKGROUND

The present invention relates to data storage systems, and more specifically, to post-decoding error checking with diagnostics for product codes.

Currently-used linear tape drives apply two-dimensional product codes for error correction coding (ECC). These product codes generally contain two orthogonally-placed component codes consisting of a C1 row code and a C2 column code. C1 and C2 codes are in general linear block codes with minimum Hamming distance d1 and d2, respectively, which may be a binary (bit-based) code, such as a binary Bose-Chaudhuri-Hocquenghem (BCH) code over Galois Field (GF) of GF(2) or a symbol-based code with symbol alphabet size Q, such as a Reed-Solomon (RS) code over $GF(Q=2^q)$ with q-bit symbols, or a nonbinary BCH code over $GF(Q=2^q)$ with q-bit symbols, etc. In storage and transmission systems, typically Q=2 (1-bit symbol, i.e., binary codes), Q=16 (4-bit symbol), Q=64 (6-bit symbol), Q=256 (8-bit symbol), Q=512 (9-bit symbol), Q=1024 (10-bit symbol), or Q=4096 (12-bit symbol), etc.

Tape storage and optical storage technologies typically use C1 and C2 codes that are RS codes, while flash memory and optical communication technologies typically use C1 and C2 codes that are binary BCH codes.

When performing error correction on decoded data using product codes, there are several potential sources of error: 1) mis-correction by the ECC decoder due to one or more decoding errors, 2) uncorrected errors remaining after decoding by the ECC decoder due to one or more decoding failures, and 3) memory errors related to instability in the error-correction of buffers and/or memory used to store data during and after the decoding.

Failure to decode a product codeword, which requires successful decoding of all C1 rows and all C2 columns within a product code, leads to a temporary and/or permanent error, and the decoder for the product code (possibly an iterative decoder) does not produce a valid product codeword. However, no diagnostics are performed after such a failure in conventional data storage and data transmission systems.

SUMMARY

In one embodiment, a system includes a controller and logic integrated with the controller, executable by the controller, or integrated with and executable by the controller. The logic is configured to perform iterative decoding on encoded data to obtain decoded data. The logic is also configured to perform post-decoding error diagnostics on a first portion of the decoded data in response to not obtaining a valid product codeword in the first portion after the iterative decoding of the encoded data.

In another embodiment, a controller-implemented method includes performing iterative decoding on encoded data to obtain decoded data. The controller-implemented method also includes performing post-decoding error diagnostics on a first portion of the decoded data in response to not obtaining a valid product codeword in the first portion after the iterative decoding of the encoded data.

In another embodiment, a computer program product includes a computer readable storage medium having program instructions embodied therewith. The embodied program instructions are executable by a controller to cause the controller to perform, by the controller, iterative decoding on encoded data to obtain decoded data. The embodied program instructions are also executable by the controller to cause the controller to perform, by the controller, post-decoding error diagnostics on a first portion of the decoded data in response to not obtaining a valid product codeword in the first portion after the iterative decoding of the encoded data.

Other aspects and embodiments of the present invention will become apparent from the following detailed description, which, when taken in conjunction with the drawings, illustrate by way of example the principles of the invention.

DETAILED DESCRIPTION

Figure 1:
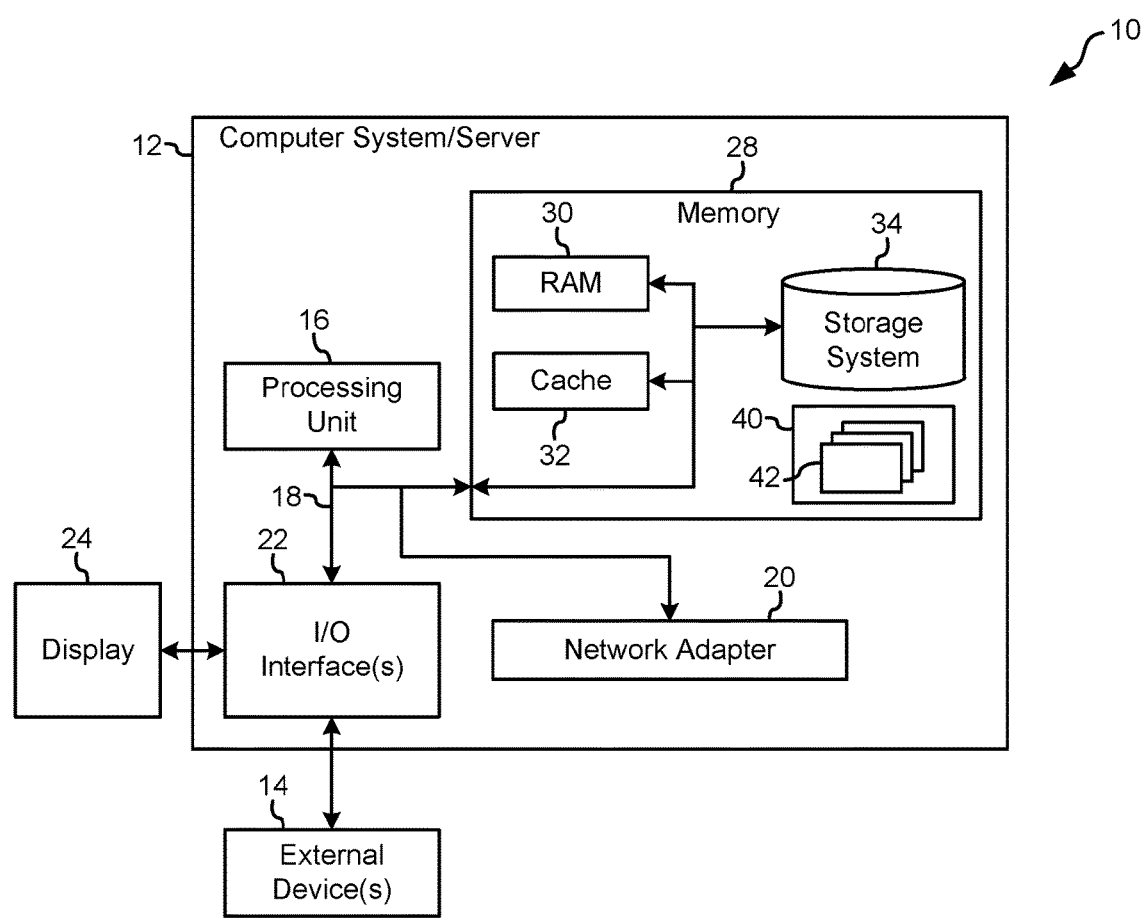
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about" ±10% of the value. For example, "about 10" indicates all values from and including 9.0 to 11.0.

The following description discloses several preferred embodiments of systems, methods, and computer program products for performing post-decoding error diagnostics on a product codeword. Error diagnostics may identify various types of errors that occur during decoding due to decoding failure, during decoding due to mis-correction, and during data storage while data is stored in memory.

When errors occur, it is desirable to identify post-decoding error types and error locations, if possible, i.e., to perform post-decoding error diagnostics. Systems, methods, and computer program products configured to verify that error correction coding (ECC) has been correctly applied to decoded data and that there have not been any errors introduced into the ECC buffers or memory after error correction has been applied are described herein according to various embodiments. Several algorithms are also described that are configured to identify the types of errors that remain after decoding a product code in specific embodiments.

In one general embodiment, a system includes a controller and logic integrated with and/or executable by the controller. The logic is configured to perform iterative decoding on encoded data to obtain decoded data. At least three decoding operations are performed in the iterative decoding, with the decoding operations being selected from a group consisting of: C1 decoding and C2 decoding. The logic is also configured to perform post-decoding error diagnostics on a first portion of the decoded data in response to not obtaining a valid product codeword in the first portion after the iterative decoding of the encoded data.

In another general embodiment, a controller-implemented method includes performing iterative decoding on encoded data to obtain decoded data. At least three decoding operations are performed in the iterative decoding, with the decoding operations being selected from a group consisting of: C1 decoding and C2 decoding. The controller-implemented method also includes performing post-decoding error diagnostics on a first portion of the decoded data in response to not obtaining a valid product codeword in the first portion after the iterative decoding of the encoded data.

In another general embodiment, a computer program product includes a computer readable storage medium having program instructions embodied therewith. The embodied program instructions are executable by a controller to cause the controller to perform, by the controller, iterative decoding on encoded data to obtain decoded data. At least three decoding operations are performed in the iterative decoding, with the decoding operations being selected from a group consisting of: C1 decoding and C2 decoding. The embodied program instructions are also executable by the controller to cause the controller to perform, by the controller, post-decoding error diagnostics on a first portion of the decoded data in response to not obtaining a valid product codeword in the first portion after the iterative decoding of the encoded data.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2:
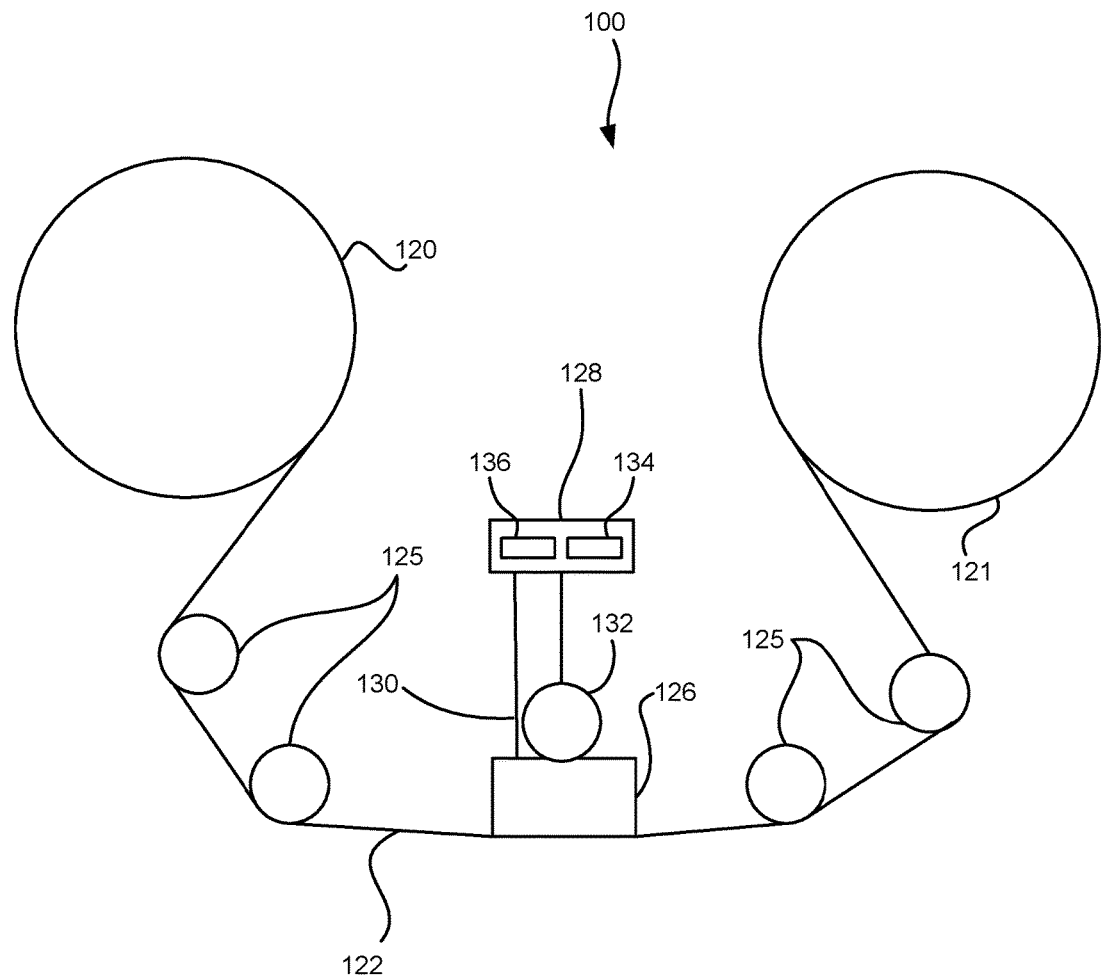
FIG. 2 illustrates a simplified tape drive of a tape-based data storage system, according to one embodiment.

FIG. 2 illustrates a simplified tape drive 100 of a tape-based data storage system, which may be employed in the context of the present invention. While one specific implementation of a tape drive is shown in FIG. 2, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 3:
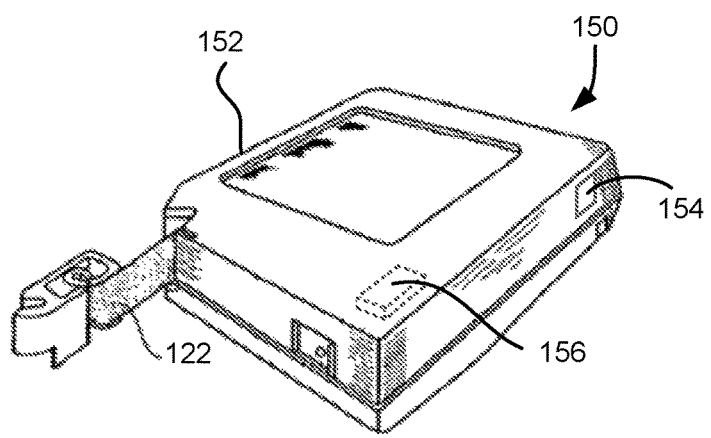
FIG. 3 is a schematic diagram of a tape cartridge according to one embodiment.

FIG. 3 illustrates an exemplary tape cartridge 150 according to one embodiment. Such tape cartridge 150 may be used with a system such as that shown in FIG. 2. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 3. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 4:
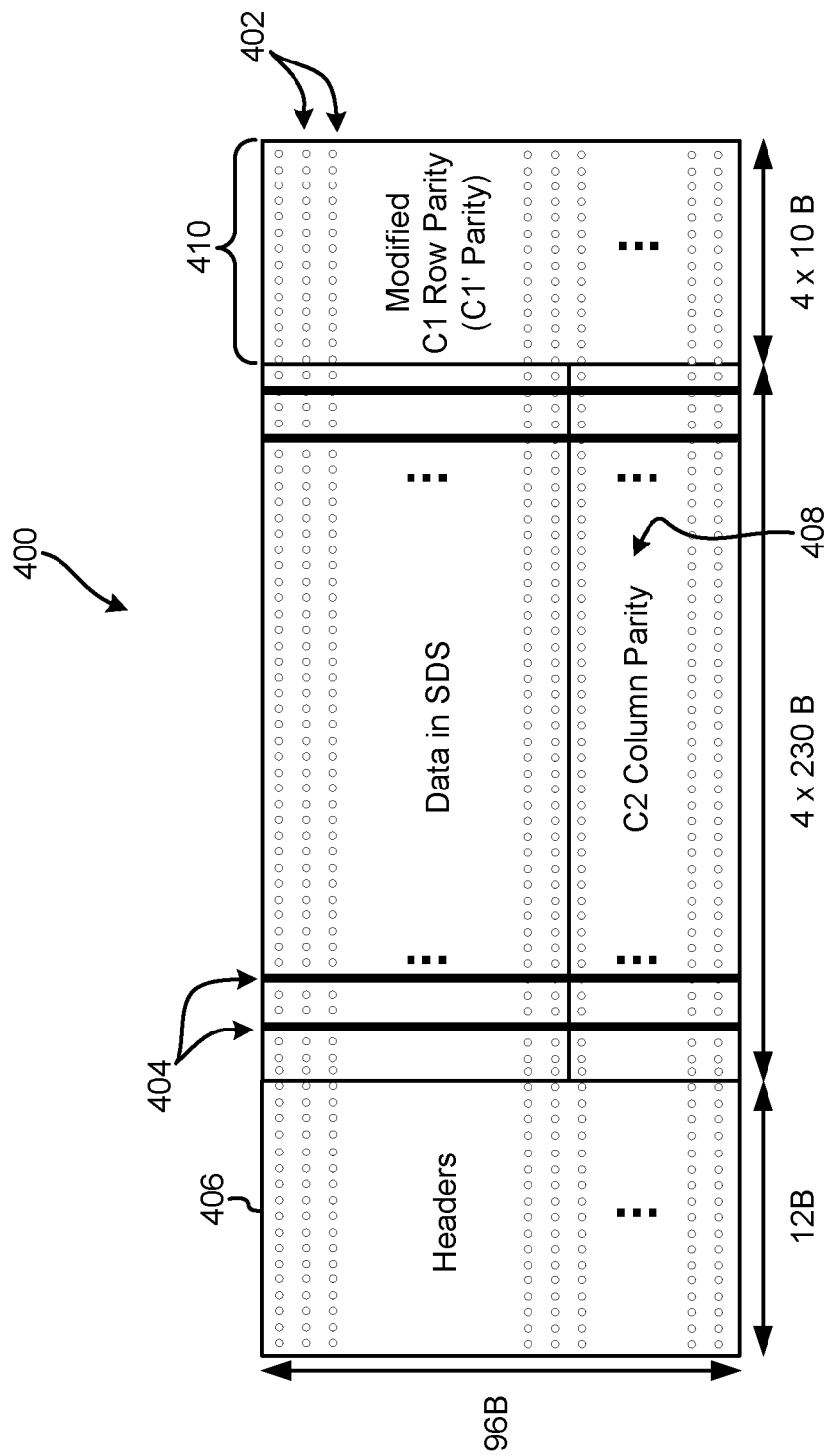
FIG. 4 shows a logical data array that may be used to organize data in a sub data set (SDS) using a product code, according to one embodiment.

FIG. 4 shows a logical data array 400 that may be used to organize data in a sub data set (SDS), according to one embodiment. As shown, the data array includes a plurality of rows 402 and columns 404. Each row 402 in the data array 400 is a codeword interleave (CWI) that includes a plurality of C1 codewords. When the CWI includes four interleaved codewords, it is referred to as a CWI-4. The data in the SDS is protected by C1 encoding across each row 402 to produce C1 row parity (not shown as it is modified later to produce the data array 400), and by C2 encoding across each column 404 to produce C2 column parity 408.

As shown, the headers 406 for each row 402 may be encoded using a C1 encoding scheme by modifying the C1 parity (computed for the data in the row 402 only) to account for the headers 406 to produce C1' parity 410. In this embodiment, the headers 406 are protected by one-level ECC (C1' parity 410 only), whereas the data is protected by two-level ECC (C1' parity 410 and C2 parity 408).

Each data set includes multiple sub data sets and each sub data set may be represented by a logical two-dimensional array. Usually hundreds of headers are assigned to a single data set because each data set includes multiple SDSs and each row (CWI) of a column-encoded SDS is assigned a header. Currently-used linear tape drives simultaneously write and read up to 32 tracks to and/or from a magnetic tape medium. C1 row codewords of a product code are written in a byte-interleaved fashion onto a plurality of individual tracks of the magnetic tape medium, and are then read from these individual tracks simultaneously.

The existing power of ECC, regardless of the type of ECC used, may be leveraged, according to embodiments described herein, to determine whether a mis-correction by the ECC decoder has occurred. The ECC may also be used to determine types of any errors that occur in the error-correction buffers and/or memories of the decoder, such as due to instability of the devices themselves.

According to one embodiment, iterative decoding may include three decoding operations: C1 decoding, followed by C2 decoding, and then C1 decoding again.

In an alternate embodiment, iterative decoding may include three decoding operations in a different order: C2 decoding, followed by C1 decoding, and then C2 decoding again. In each of these embodiments, more decoding steps may be performed after the last C1 or C2 decoding operation, alternating between C1 and C2 decoding.

In one specific embodiment, iterative decoding may utilize a C1 code that is a Reed-Solomon RS(240,228) code with a codeword length (N1) equal to 240 and a minimum Hamming distance (d1) equal to 13 (i.e., N1=240, d1=13), and a C2 code that is a RS(192,168) code with a codeword length (N2) equal to 192 and a minimum Hamming distance (d2) equal to 25 (i.e., N2=192, d2=25).

The ECC decoder may be configured to perform C1-C2-C1 iterative decoding followed by a C2 syndrome check and a C1 syndrome check while operating in streaming mode. The decoding of the encoded data (which includes a received product codeword) is deemed successful after decoding if and only if all C1 codewords in an individual product codeword are permitted (i.e., all C1 codewords have zero syndrome which is equivalent to all C1 codewords passing the C1 syndrome check) and all C2 codewords in the same individual product codeword are permitted (i.e., all C2 codewords have zero syndrome which is equivalent to all C2 codewords passing the C2 syndrome check). Otherwise, the decoding is deemed to be unsuccessful.

In an alternate embodiment, the ECC decoder may be configured to perform C2-C1-C2 iterative decoding followed by a C1 syndrome check and a C2 syndrome check while operating in streaming mode. The determination of successful decoding is unchanged from above.

After decoding the encoded data having the received product codeword therein is completed, error sources may be checked. The error sources may be from various different contributors, such as channel errors (due to decoding failure), decoding errors due to decoder error (due to mis-correction), and memory errors in the buffers and/or memory of the decoder and/or system (such as embedded dynamic random access memory (eDRAM), etc.)

Post-decoding error checking may include determining one or more error signatures for any errors detected in an unsuccessfully decoded product codeword. These error signatures may be determined based on a plurality of parameters that are ascertainable from the ECC decoding. For example, the error signatures of any errors remaining in the decoded data after a final C1 decoding operation may be defined using the parameters U, U', W, W', D, D', M, and M' where: U is determined as a number of uncorrectable C1 codewords (C1 decoding failures) in a received product codeword after the last C1 decoding operation, U' is determined as a number of uncorrectable C2 codewords (C2 decoding failures) in a received product codeword after the last C2 decoding operation, W is determined as a number of C1 codewords with nonzero syndrome in a received product codeword (illegal C1 codewords) that are detected after performing C1 syndrome check, W' is determined as a number of C2 codewords with nonzero syndrome in a received product code word (illegal C2 codewords) that are detected after performing C2 syndrome check, D is determined as a number of C1 codewords other than the U uncorrectable C1 codewords in a received product codeword that have at least d1 symbol errors detected after determining C2 error locations (d1 is the minimum Hamming distance for the C1 code), D' is determined as a number of C2 codewords other than the U' uncorrectable C2 codewords in a received product codeword that have at least d2 symbol errors detected after determining C1 error locations (d2 is the minimum Hamming distance for the C2 code), M is determined as a number of C1 codewords other than the U uncorrectable C1 codewords in a decoded product codeword that have less than d1 symbol errors detected after determining C2 error locations, and M' is determined as a number of C2 codewords other than the U' uncorrectable C2 codewords in a decoded product codeword that have less than d2 symbol errors detected after determining C1 error locations. The C1 and C2 error locations may be determined from the syndrome polynomial by solving the key equation. For example, the Euclidean algorithm may be used to solve the key equation in the C1 decoder and the C2 decoder.

The plurality of error signatures may be represented by a binary 3-tuple, as shown in Table 1, below, for a decoding sequence which has C1 decoding performed last. Each tuple (S) is defined as S=[c d m]. The values of c, d, and m are set as follows: c=0 in response to U=0, and c=1 in response to U>0 indicating the presence of a channel error after C1 decoding; d=0 in response to D=0, and d=1 in response to D>0 indicating the presence of a C1 decoder error (mis-correction); and m=0 in response to M=0, and m=1 in response to M>0 indicating the presence of a memory error.

TABLE 1

Error Signatures for C1 Decoding Last

| Channel Error | Decoder Error | Memory Error | Error Signature (S) |
| --- | --- | --- | --- |
| No | No | No | [0 0 0] |
| No | No | Yes | [0 0 1] |
| No | Yes | No | [0 1 0] |
| No | Yes | Yes | [0 1 1] |
| Yes | No | No | [1 0 0] |
| Yes | No | Yes | [1 0 1] |
| Yes | Yes | No | [1 1 0] |
| Yes | Yes | Yes | [1 1 1] |

Another plurality of error signatures may be represented by a binary 3-tuple, as shown in Table 2, below, for a decoding sequence which has C2 decoding performed last. Each tuple (S') is defined as S'=[c' d' m']. The values of c', d', and m' are set as follows: c'=0 in response to U'=0, and c'=1 in response to U'>0 indicating the presence of a channel error after C2 decoding; d'=0 in response to D'=0, and d'=1 in response to D'>0 indicating the presence of a C2 decoder error (mis-correction); and m'=0 in response to M'=0, and m'=1 in response to M'>0 indicating the presence of a memory error.

TABLE 2

Error Signatures for C2 Decoding Last

| Channel Error | Decoder Error | Memory Error | Error Signature (S) |
| --- | --- | --- | --- |
| No | No | No | [0 0 0] |
| No | No | Yes | [0 0 1] |
| No | Yes | No | [0 1 0] |
| No | Yes | Yes | [0 1 1] |
| Yes | No | No | [1 0 0] |
| Yes | No | Yes | [1 0 1] |
| Yes | Yes | No | [1 1 0] |
| Yes | Yes | Yes | [1 1 1] |

More or less types of errors may be defined and may be identified in the decoded data as would be apparent to one of skill in the art upon reading the present descriptions. Furthermore, the tuple may have more or less entries, e.g., a binary 2-tuple, a binary 4-tuple, etc., to correspond with the error types that are to be diagnosed in the decoded data.

In FIGS. 5A-12B, for the sake of the descriptions herein, it may be assumed that the product code used to create the decoded product codewords shown in each Figure may be based on a RS(N1,K1) C1 code with d1=5 and a RS(N2,K2) C2 code over GF(256) with d2=5. Of course, any other suitable product code may be used, and this product code is elected for ease of description only, and is not limiting in any way on the product codes that may be used in conjunction with the embodiments described herein.

Moreover, the descriptions of the resulting decoded product codewords in FIGS. 5A-12B are applicable for any linear block code C1 over GF(Q) and C2 over GF(Q) with minimum Hamming distance d1 and d2, respectively.

Figure 5A:
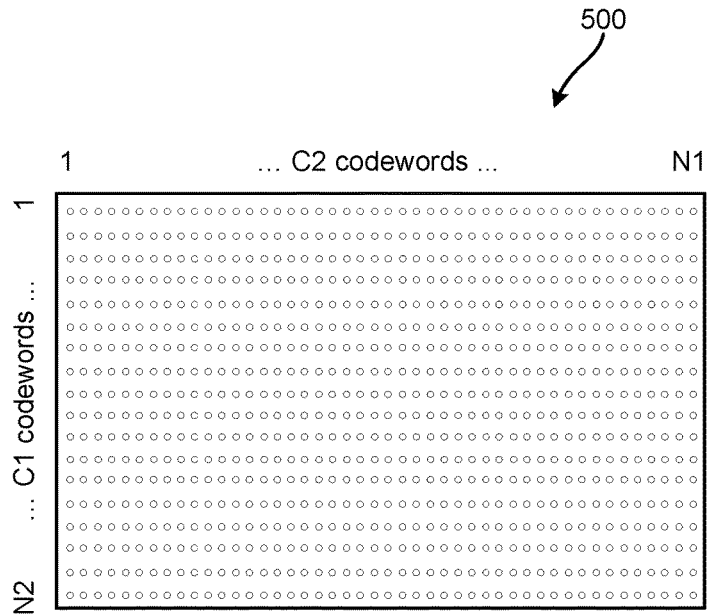
FIG. 5A shows a product codeword with no detected errors produced from iterative decoding having a C1 decoding operation last, according to one embodiment.

Now referring to FIG. 5A, a decoded product codeword 500 is shown according to one possible result of iterative decoding having C1 decoding as a last decoding operation. The decoded product codeword 500 has N1 columns and N2 rows, making it a two-dimensional N1×N2 product codeword.

In the decoded product codeword 500, there are no detectable errors present, as all symbols therein were either decoded without error, or were able to be corrected during the iterative decoding that produced this decoded product codeword 500. Although some of the plurality of symbols in this product codeword 500 may be incorrectly decoded (different from what was stored to the medium from which the decoded data was read, or different from the data which produced the encoded data), the iterative decoding was not able to detect such errors; therefore, this is a valid product codeword.

In one exemplary embodiment, assuming the product code described above, in the decoded product codeword 500, U=0, W'=0, and M=0 for an error signature of S=[0 0 0]. This results from all C1 codewords and C2 codewords in the decoded product codeword 500 being permitted codewords and therefore there is no uncorrected C1 codewords (U=0) and the syndromes of all C2 codewords are zero (W'=0). Moreover, no memory errors are detected (M=0) in a buffer memory, such as an eDRAM or some other suitable buffer memory.

Figure 5B:
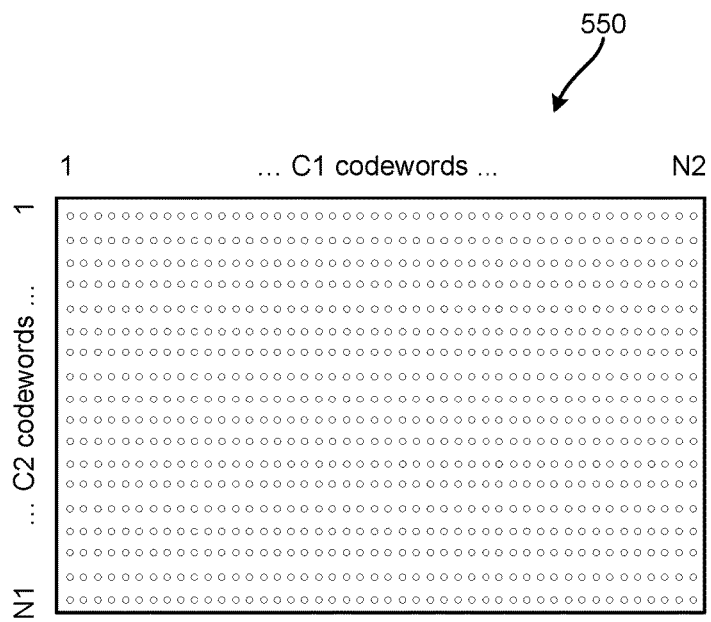
FIG. 5B shows a product codeword with no detected errors produced from iterative decoding having a C2 decoding operation last, according to one embodiment.

FIG. 5B shows a decoded product codeword 550 according to one possible result of iterative decoding having C2 decoding as a last decoding operation. The decoded product codeword 550 has N2 columns and N1 rows, making it a two-dimensional N2×N1 product codeword. In the decoded product codeword 550, U'=0, W=0, and M'=0 for an error signature of S'=[0 0 0] because all C1 codewords and C2 codewords in the decoded product codeword 550 are permitted codewords and therefore there is no uncorrected C2 codewords (U'=0) and the syndromes of all C1 codewords are zero (W=0). Moreover, no memory errors are detected (M'=0) in a buffer memory, such as an eDRAM or some other suitable buffer memory.

Figure 6A:
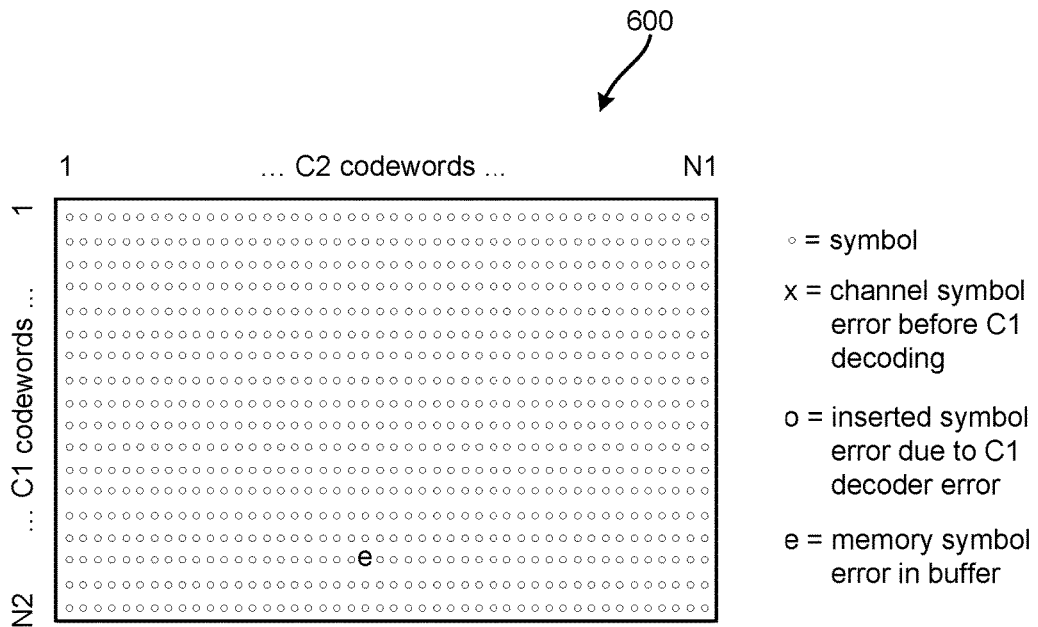
FIG. 6A shows a product codeword with a detected memory error produced from iterative decoding having a C1 decoding operation last, according to one embodiment.

Now referring to FIG. 6A, a decoded product codeword 600 is shown according to one possible result of iterative decoding having C1 decoding as a last decoding operation. In the decoded product codeword 600, there is one detectable error present, a memory symbol error (e) due to incorrect storage of the symbol associated with the memory symbol error in buffer memory. Although some of the other plurality of symbols in this product codeword 600 may be incorrectly decoded (different from what was stored to the medium from which the decoded data was read, or different from the data which produced the encoded data), the iterative decoding was not able to detect such errors; however, due to the memory system error, this is not a valid product codeword.

In the decoded product codeword 600, U=0, W'=1, W=1, and M=1 for an error signature of S=[0 0 1] because there are no uncorrected C1 codewords (U=0), only one C2 codeword has a nonzero syndrome (W'=1) in the decoded product codeword 600, one of the C1 codewords has a nonzero syndrome (W=1) in the decoded product codeword 600, and a memory error is detected (M=1) due to one C1 codeword other than U having less than d1 symbol errors.

Figure 6B:
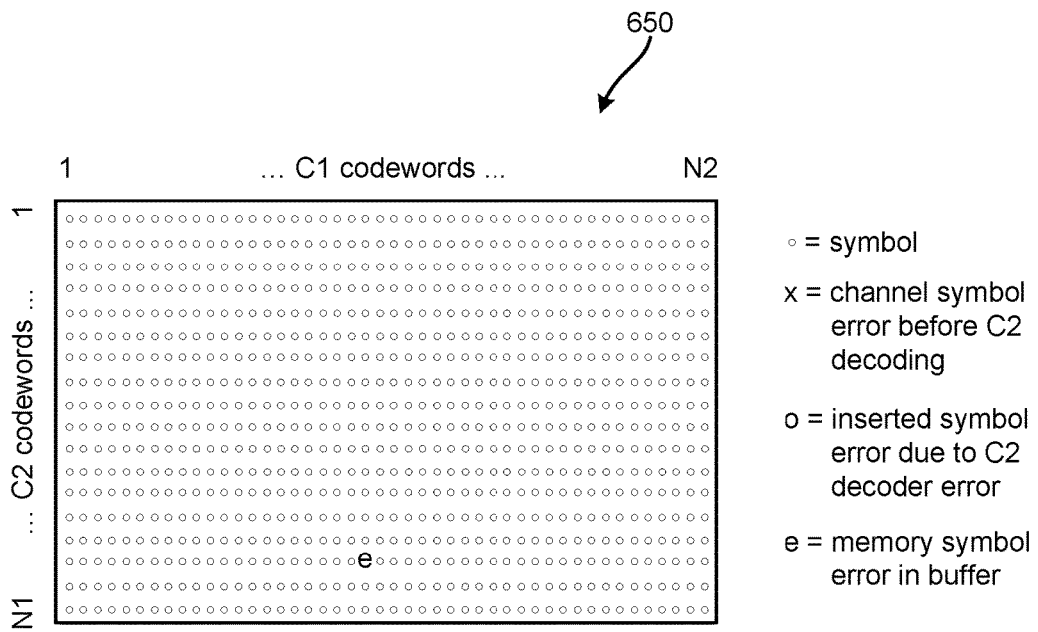
FIG. 6B shows a product codeword with a detected memory error produced from iterative decoding having a C2 decoding operation last, according to one embodiment.

FIG. 6B shows a decoded product codeword 650 according to one possible result of iterative decoding having C2 decoding as a last decoding operation. The error signature for this decoded product codeword 650 would be S'=[0 0 1] resulting from U'=0, W=1, W'=1, and M'=1 because there are no uncorrected C2 codewords (U'=0), only one C2 codeword has a nonzero syndrome (W'=1) in the decoded product codeword 650, one of the C1 codewords has a nonzero syndrome (W=1) in the decoded product codeword 650, and a memory error is detected (M'=1) due to one C2 codeword other than U' having less than d2 symbol errors.

Figure 7A:
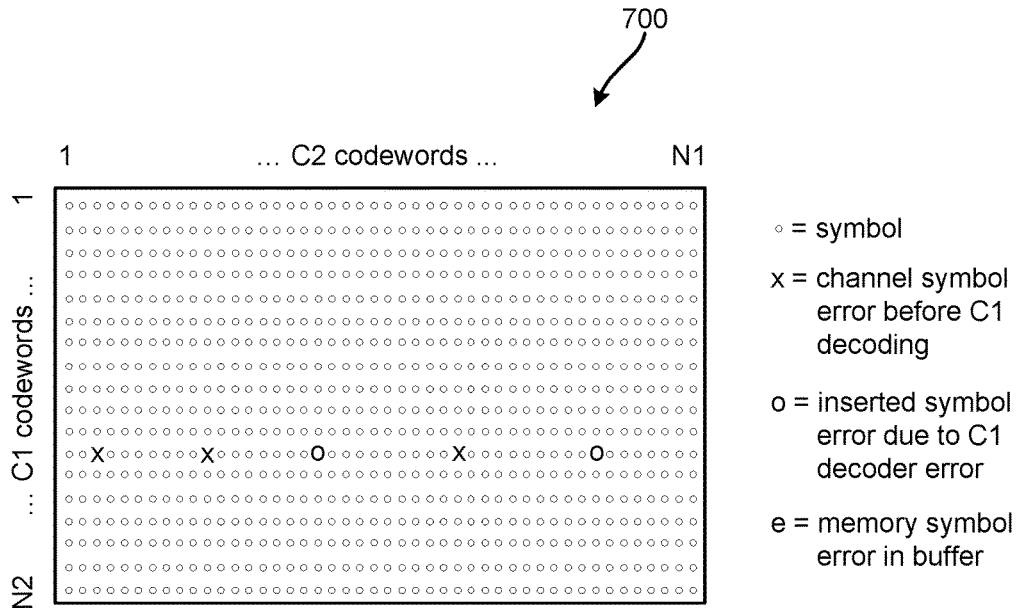
FIG. 7A shows a product codeword with a combination of channel and inserted symbol errors produced from iterative decoding having a C1 decoding operation last, according to one embodiment.

Now referring to FIG. 7A, a decoded product codeword 700 is shown according to one possible result of iterative decoding having C1 decoding as a last decoding operation. In the decoded product codeword 700, there are several errors present in the same C1 codeword, including channel symbol errors (x) before C1 decoding, and inserted symbol errors (o) due to C1 decoder error. Although some of the other plurality of symbols in this product codeword 700 may be incorrectly decoded (different from what was stored to the medium from which the decoded data was read, or different from the data which produced the encoded data), the iterative decoding was not able to detect such errors; however, due to the combination of errors, this is not a valid product codeword.

In the decoded product codeword 700, U=0, W'=5, W=0, D=1, and M=0 for an error signature of S=[0 1 0] because there are no uncorrected C1 codewords (U=0), five C2 codewords have a nonzero syndrome (W'=5) in the decoded product codeword 700, none of the C1 codewords has a nonzero syndrome (W=0) in the decoded product codeword 700, zero C1 codewords other than U have at least d1 symbol errors detected after determining C2 error locations (D=0), and no memory errors are detected (M=0).

Figure 7B:
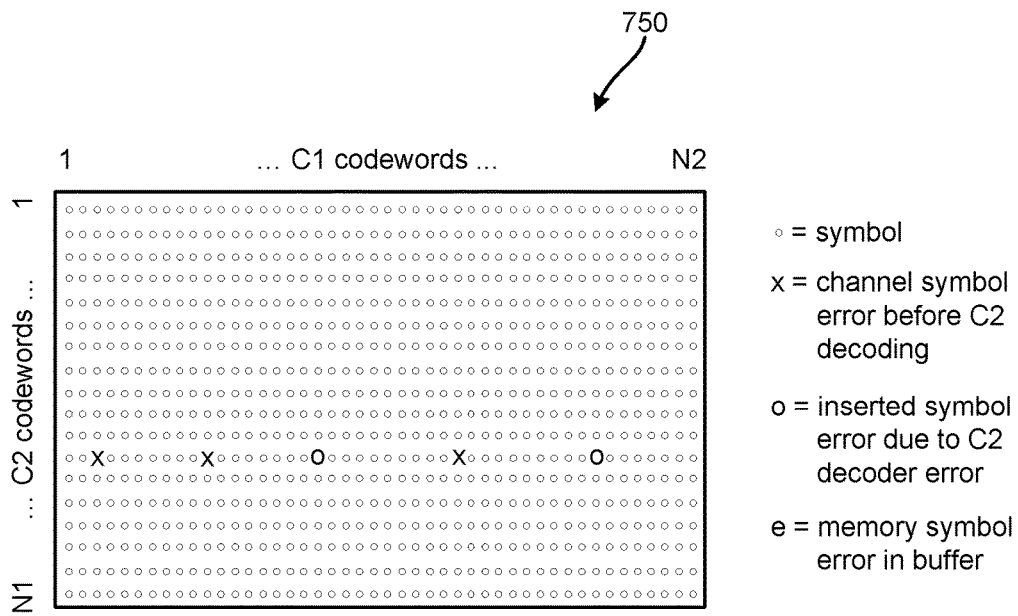
FIG. 7B shows a product codeword with a combination of channel and inserted symbol errors produced from iterative decoding having a C2 decoding operation last, according to one embodiment.

FIG. 7B shows a decoded product codeword 750 according to one possible result of iterative decoding having C2 decoding as a last decoding operation. The error signature for this decoded product codeword 750 would be S'=[0 1 0] resulting from U'=0, W=5, W'=0, D'=1, and M'=0 because there are no uncorrected C2 codewords (U'=0), no C2 codewords have a nonzero syndrome (W'=0) in the decoded product codeword 750, five of the C1 codewords has a nonzero syndrome (W=5) in the decoded product codeword 750, zero C2 codewords other than U' have at least d2 symbol errors detected after determining C1 error locations (D'=0), and no memory errors are detected (M'=0).

Figure 8A:
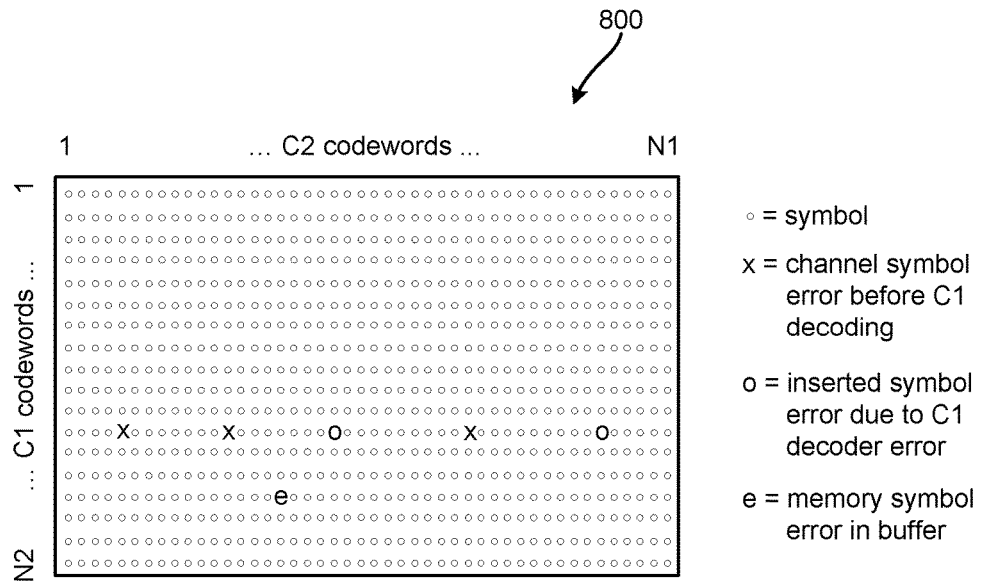
FIG. 8A shows a product codeword with a combination of channel, memory, and inserted symbol errors produced from iterative decoding having a C1 decoding operation last, according to one embodiment.

Now referring to FIG. 8A, a decoded product codeword 800 is shown according to one possible result of iterative decoding having C1 decoding as a last decoding operation. In the decoded product codeword 800, there are several errors present in the same C1 codeword, including channel symbol errors (x) before C1 decoding, and inserted symbol errors (o) due to C1 decoder error, and one memory error (e) in another C1 codeword. Although some of the other plurality of symbols in this product codeword 800 may be incorrectly decoded (different from what was stored to the medium from which the decoded data was read, or different from the data which produced the encoded data), the iterative decoding was not able to detect such errors; however, due to the combination of errors, this is not a valid product codeword.

In the decoded product codeword 800, U=0, W'=6, W=1, D=1, and M=1 for an error signature of S=[0 1 1] because there are no uncorrected C1 codewords (U=0), six C2 codewords that have a nonzero syndrome (W'=6) in the decoded product codeword 800, one of the C1 codewords has a nonzero syndrome (W=1) in the decoded product codeword 800 due to the memory error, one C1 codeword other than U has at least d1 symbol errors detected after determining C2 error locations (D=1), and one memory error is detected (M=1) due to one C1 codeword other than U having less than d1 symbol errors detected after determining C2 error locations.

Figure 8B:
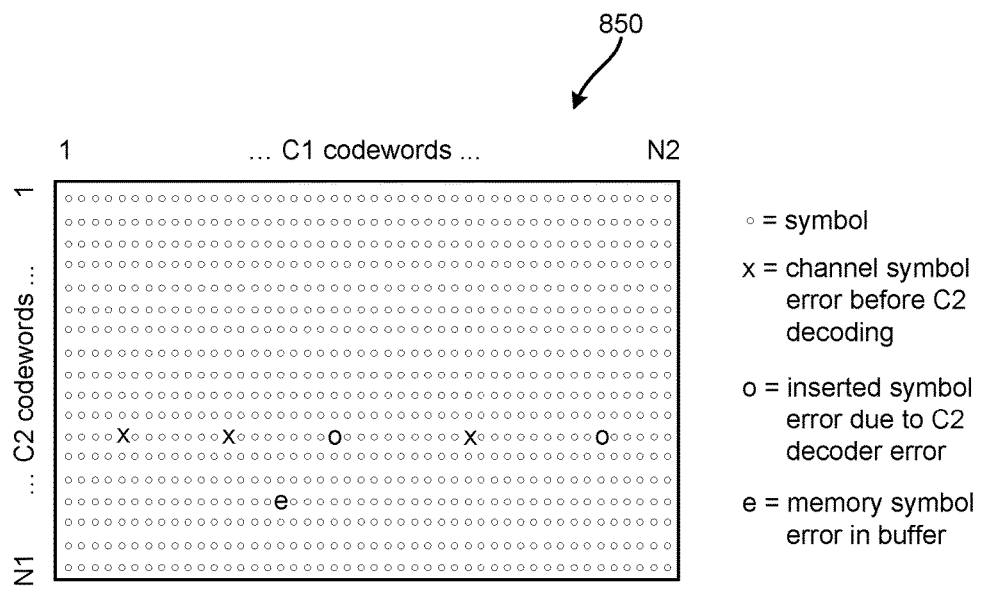
FIG. 8B shows a product codeword with a combination of channel, memory, and inserted symbol errors produced from iterative decoding having a C2 decoding operation last, according to one embodiment.

FIG. 8B shows a decoded product codeword 850 according to one possible result of iterative decoding having C2 decoding as a last decoding operation. The error signature for this decoded product codeword 850 would be S'=[0 1 1] resulting from U'=0, W'=1, W=6, D'=1, and M'=1 because there are no uncorrected C2 codewords (U'=0), one C2 codeword has a nonzero syndrome (W'=1) in the decoded product codeword 850, six of the C1 codewords has a nonzero syndrome (W=6) in the decoded product codeword 850, one C2 codeword other than U' has at least d2 symbol errors detected after determining C1 error locations (D'=1), and one memory error is detected (M'=1).

Figure 9A:
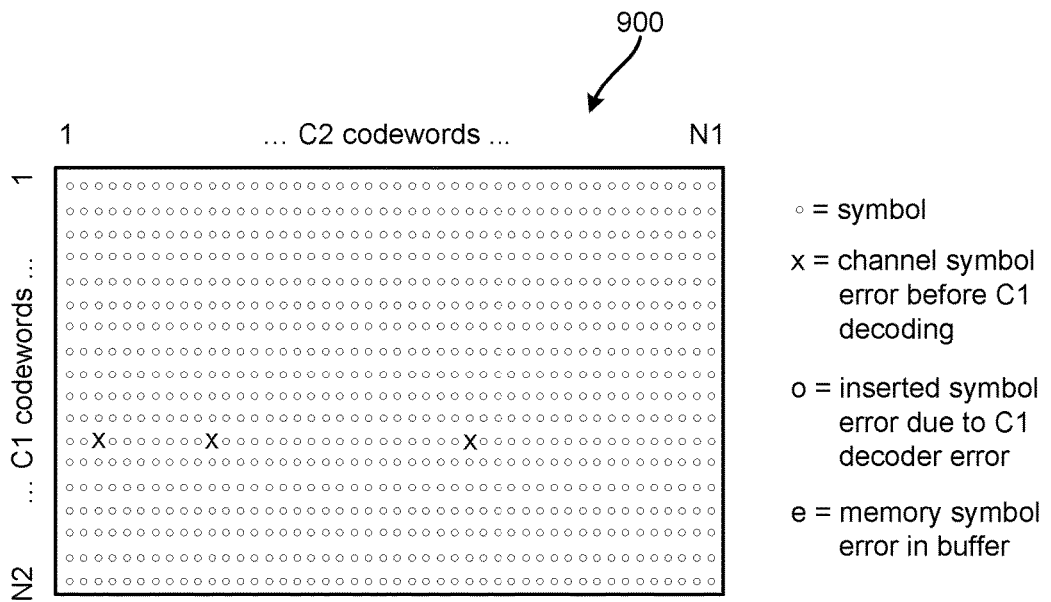
FIG. 9A shows a product codeword with detected channel errors produced from iterative decoding having a C1 decoding operation last, according to one embodiment.

Now referring to FIG. 9A, a decoded product codeword 900 is shown according to one possible result of iterative decoding having C1 decoding as a last decoding operation. In the decoded product codeword 900, there are several errors present in the same C1 codeword: three channel symbol errors (x) before C1 decoding. Although some of the other plurality of symbols in this product codeword 900 may be incorrectly decoded (different from what was stored to the medium from which the decoded data was read, or different from the data which produced the encoded data), the iterative decoding was not able to detect such errors; however, due to the channel symbol errors, this is not a valid product codeword.

In the decoded product codeword 900, U=1, W'=3, W=1, D=0, and M=0 for an error signature of S=[1 0 0] because there is one uncorrected C1 codeword (U=1), three C2 codewords have a nonzero syndrome (W'=3) in the decoded product codeword 900, one of the C1 codewords has a nonzero syndrome (W=1) in the decoded product codeword 900, zero C1 codewords other than U have at least d1 symbol errors detected after determining C2 error locations (D=0), and no memory errors are detected (M=0).

Figure 9B:
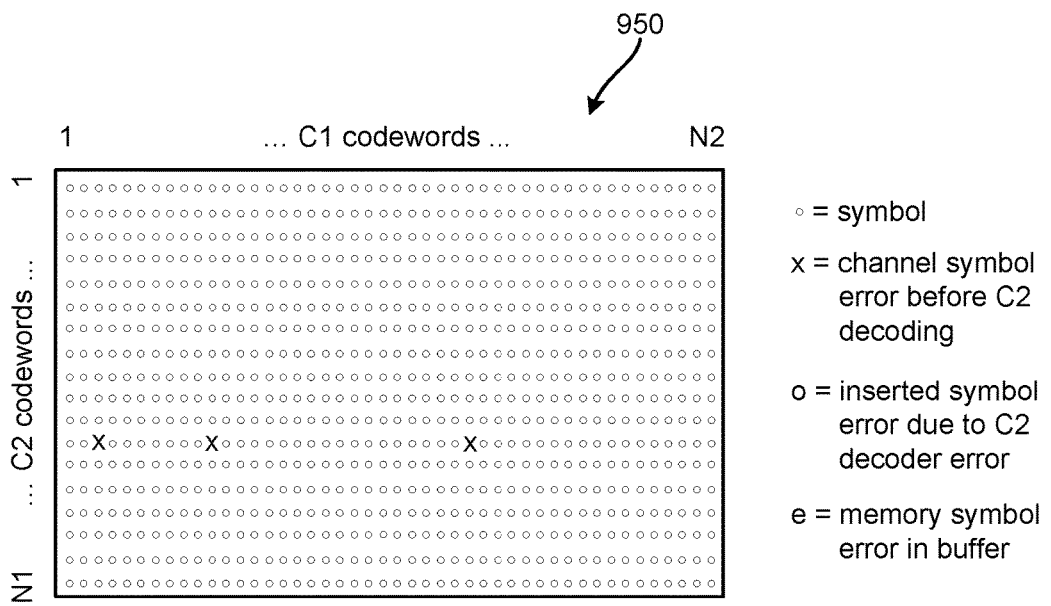
FIG. 9B shows a product codeword with detected channel errors produced from iterative decoding having a C2 decoding operation last, according to one embodiment.

FIG. 9B shows a decoded product codeword 950 according to one possible result of iterative decoding having C2 decoding as a last decoding operation. The error signature for this decoded product codeword 950 would be S'=[1 0 0] resulting from U'=1, W=1, W'=3, D'=0, and M'=0 because there is one uncorrected C2 codeword (U'=1), three C2 codewords have a nonzero syndrome (W'=3) in the decoded product codeword 950, one of the C1 codewords has a nonzero syndrome (W=1) in the decoded product codeword 950, no C2 codeword other than U' has at least d2 symbol errors detected after determining C1 error locations (D'=0), and no memory error is detected (M'=0).

Figure 10A:
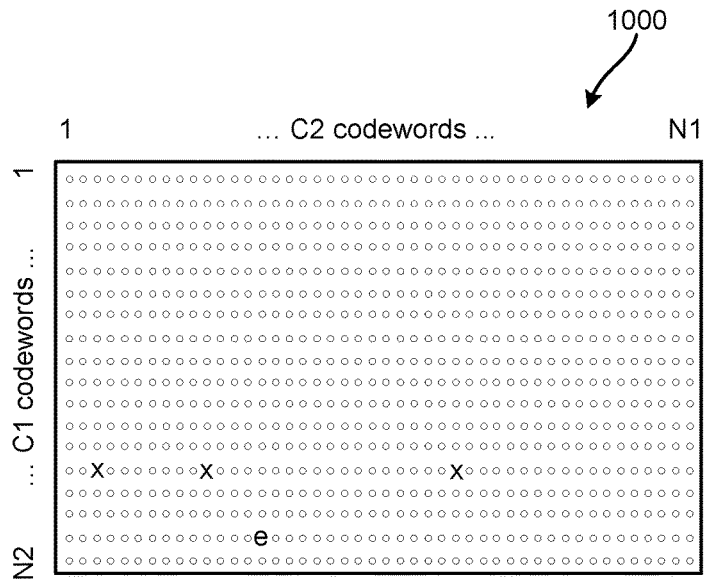
FIG. 10A shows a product codeword with a combination of channel and memory errors produced from iterative decoding having a C1 decoding operation last, according to one embodiment.

Now referring to FIG. 10A, a decoded product codeword 1000 is shown according to one possible result of iterative decoding having C1 decoding as a last decoding operation. In the decoded product codeword 1000, there are several errors present in the same C1 codeword, including three channel symbol errors (x) before C1 decoding, and a memory error (e) in a different C1 codeword. Although some of the other plurality of symbols in this product codeword 1000 may be incorrectly decoded (different from what was stored to the medium from which the decoded data was read, or different from the data which produced the encoded data), the iterative decoding was not able to detect such errors; however, due to the combination of errors, this is not a valid product codeword.

In the decoded product codeword 1000, $U=1$, $W'=4$, $W=2$, $D=0$, and $M=1$ for an error signature of $S=[1\ 0\ 1]$ because there is one uncorrected C1 codeword ($U=1$), four C2 codewords have a nonzero syndrome ($W'=4$) in the decoded product codeword 1000, two of the C1 codewords have a nonzero syndrome ($W=2$) in the decoded product codeword 1000, zero C1 codewords other than U have at least d1 symbol errors detected after determining C2 error locations ($D=0$), and one memory error is detected ($M=1$) due to one C1 codeword other than U having less than d1 symbol errors detected after determining C2 error locations.

Figure 10B:
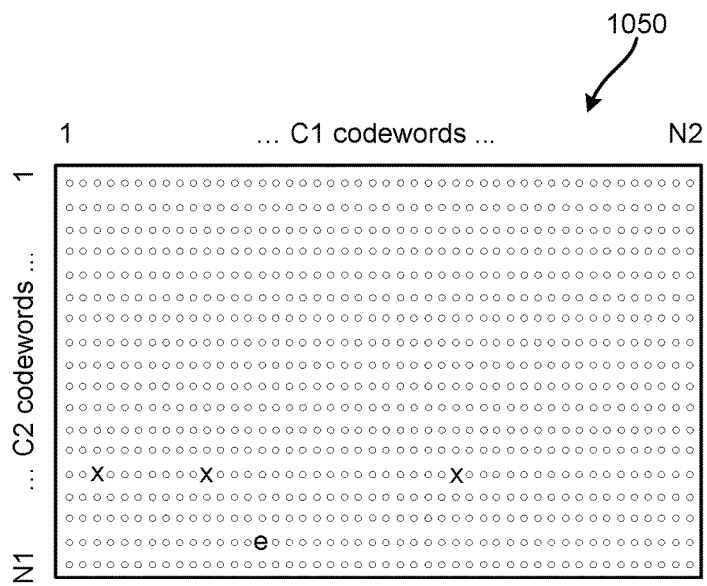
FIG. 10B shows a product codeword with a combination of channel and memory errors produced from iterative decoding having a C2 decoding operation last, according to one embodiment.

FIG. 10B shows a decoded product codeword 1050 according to one possible result of iterative decoding having C2 decoding as a last decoding operation. The error signature for this decoded product codeword 1050 would be $S'=[1\ 0\ 1]$ resulting from $U'=1$, $W=4$, $W'=2$, $D'=0$, and $M'=1$ because there is one uncorrected C2 codeword ($U'=1$), 2 C2 codewords have a nonzero syndrome ($W'=2$) in the decoded product codeword 1050, four of the C1 codewords has a nonzero syndrome ($W=4$) in the decoded product codeword 1050, no C2 codewords other than U' have at least d2 symbol errors detected after determining C1 error locations ($D'=0$), and one memory error is detected ($M'=1$).

Figure 11A:
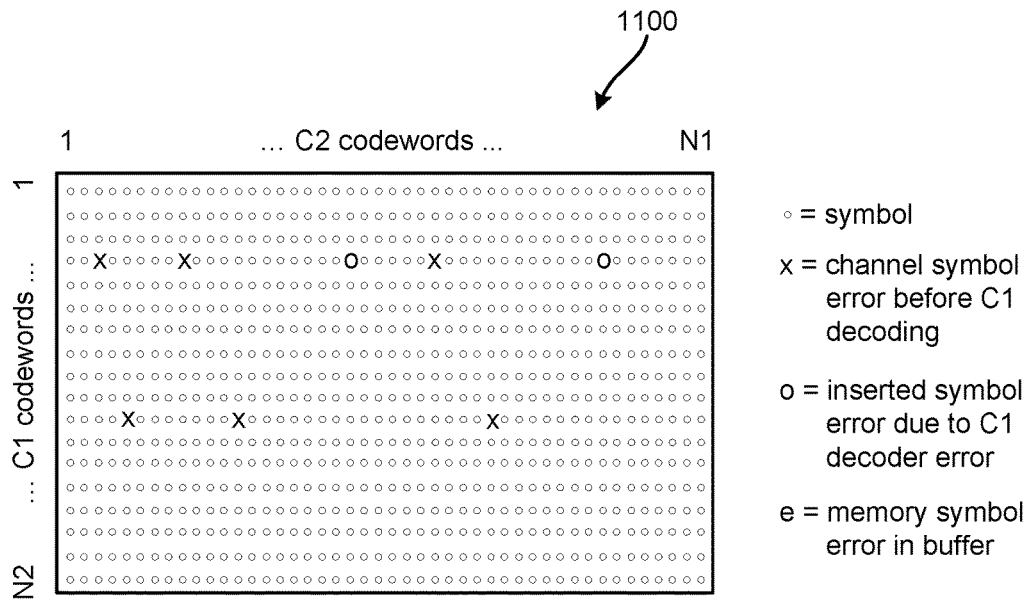
FIG. 11A shows a product codeword with a combination of channel and inserted symbol errors produced from iterative decoding having a C1 decoding operation last, according to one embodiment.

Now referring to FIG. 11A, a decoded product codeword 1100 is shown according to one possible result of iterative decoding having C1 decoding as a last decoding operation. In the decoded product codeword 1100, there are several errors present in two C1 codewords, including three channel symbol errors (x) before C1 decoding in one C1 codeword, and three more channel errors and two inserted symbol errors (o) due to C1 decoder error in a different C1 codeword. Although some of the other plurality of symbols in this product codeword 1100 may be incorrectly decoded (different from what was stored to the medium from which the decoded data was read, or different from the data which produced the encoded data), the iterative decoding was not able to detect such errors; however, due to the combination of errors, this is not a valid product codeword.

In the decoded product codeword 1100, $U=1$, $W'=8$, $W=1$, $D=1$, and $M=0$ for an error signature of $S=[1\ 1\ 0]$ because there is one uncorrected C1 codeword ($U=1$), eight C2 codewords have a nonzero syndrome ($W'=8$) in the decoded product codeword 1100, one of the C1 codewords has a nonzero syndrome ($W=1$) in the decoded product codeword 1100, one C1 codeword other than U has at least d1 symbol errors detected after determining C2 error locations ($D=1$), and no memory errors are detected ($M=0$).

Figure 11B:
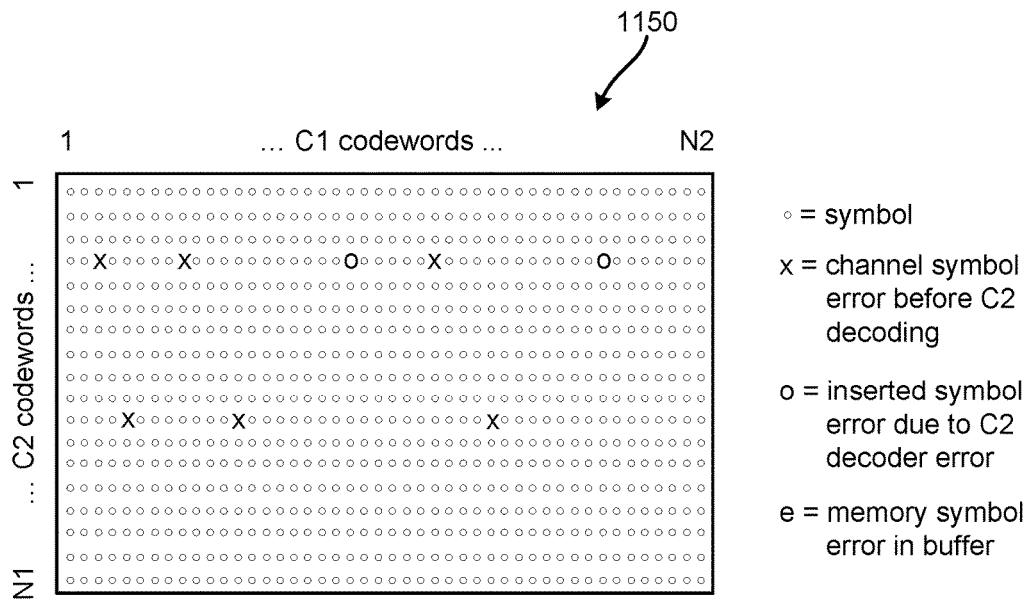
FIG. 11B shows a product codeword with a combination of channel and inserted symbol errors produced from iterative decoding having a C2 decoding operation last, according to one embodiment.

FIG. 11B shows a decoded product codeword 1150 according to one possible result of iterative decoding having C2 decoding as a last decoding operation. The error signature for this decoded product codeword 1150 would be $S'=[1\ 1\ 0]$ resulting from $U'=1$, $W=8$, $W'=1$, $D'=1$, and $M'=0$ because there is one uncorrected C2 codeword ($U'=1$), one C2 codeword has a nonzero syndrome ($W'=1$) in the decoded product codeword 1150, eight of the C1 codewords has a nonzero syndrome ($W=8$) in the decoded product codeword 1150, one C2 codeword other than U' has at least d2 symbol errors detected after determining C1 error locations ($D'=1$), and no memory errors are detected ($M'=0$).

Figure 12A:
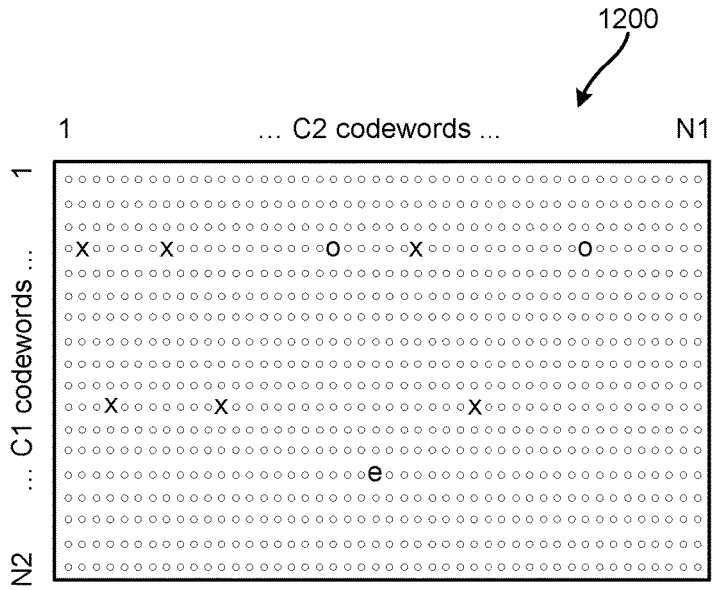
FIG. 12A shows a product codeword with a combination of channel, memory produced from iterative decoding having a C1 decoding operation last, and inserted symbol errors, according to one embodiment.

Now referring to FIG. 12A, a decoded product codeword 1200 is shown according to one possible result of iterative decoding having C1 decoding as a last decoding operation. In the decoded product codeword 1200, there are several errors present in three C1 codewords, including three channel symbol errors (x) before C1 decoding in one C1 codeword, three more channel errors and two inserted symbol errors (o) due to C1 decoder error in a second C1 codeword, and a memory error in a third C1 codeword. Although some of the other plurality of symbols in this product codeword 1200 may be incorrectly decoded (different from what was stored to the medium from which the decoded data was read, or different from the data which produced the encoded data), the iterative decoding was not able to detect such errors; however, due to the combination of errors, this is not a valid product codeword.

In the decoded product codeword 1200, $U=1$, $W'=9$, $W=2$, $D=1$, and $M=1$ for an error signature of $S=[1\ 1\ 1]$ because there is one uncorrected C1 codeword ($U=1$), nine C2 codewords have a nonzero syndrome ($W'=9$) in the decoded product codeword 1200, two of the C1 codewords has a nonzero syndrome ($W=2$) in the decoded product codeword 1200, one C1 codeword other than U has at least d1 symbol errors detected after determining C2 error locations ($D=1$), and one memory error is detected ($M=1$) due to one C1 codeword other than U having less than d1 symbol errors detected after determining C2 error locations.

Figure 12B:
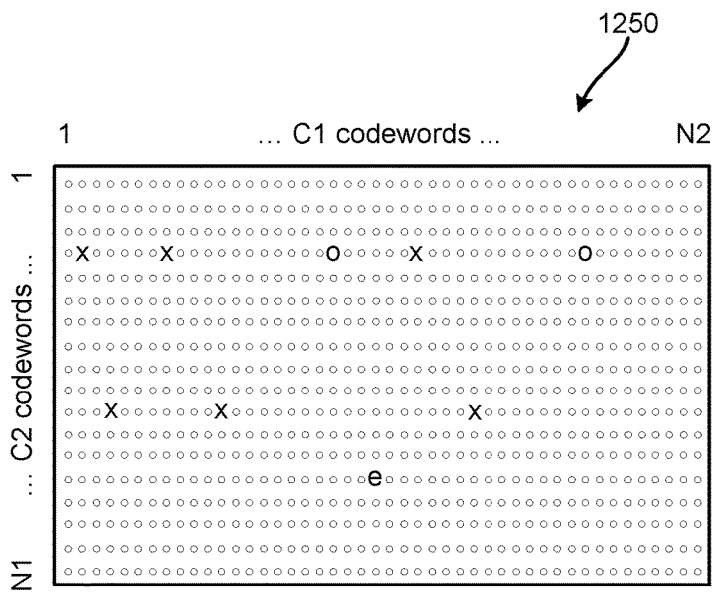
FIG. 12B shows a product codeword with a combination of channel, memory produced from iterative decoding having a C2 decoding operation last, and inserted symbol errors, according to one embodiment.

FIG. 12B shows a decoded product codeword 1250 according to one possible result of iterative decoding having C2 decoding as a last decoding operation. The error signature for this decoded product codeword 1250 would be $S'=[1\ 1\ 1]$ resulting from $U'=1$, $W=9$, $W'=2$, $D'=1$, and $M'=1$ because there is one uncorrected C2 codeword ($U'=1$), two C2 codewords have a nonzero syndrome ($W'=2$) in the decoded product codeword 1250, nine of the C1 codewords has a nonzero syndrome ($W=9$) in the decoded product codeword 1250, one C2 codeword other than U' has at least d2 symbol errors detected after determining C1 error locations ($D'=1$), and one memory error is detected ($M'=1$).

For product codes used in solid-state memory, optical storage, optical transmission, etc., the post-diagnostics actions may also be used (e.g., the results of the diagnostics) in an error recovery procedure (ERP), which is sometimes referred to as a data recovery procedure (DRP). There are two embodiments for ERP or DRP: a) repeat decoding of the data in response to the data still being available in a buffer, such as in the case of an error occurring during the storage of decoded data in a buffer (memory error, soft error), or b) reread the data from the optical/magnetic/solid-state medium and either repeat decoding of the data in response to the reread waveform from the optical/magnetic/solid-state medium or decode the reread waveform with additional decoding or more powerful decoding (e.g., a higher number of C1/C2 iterations to achieve successful decoding).

Figure 13:
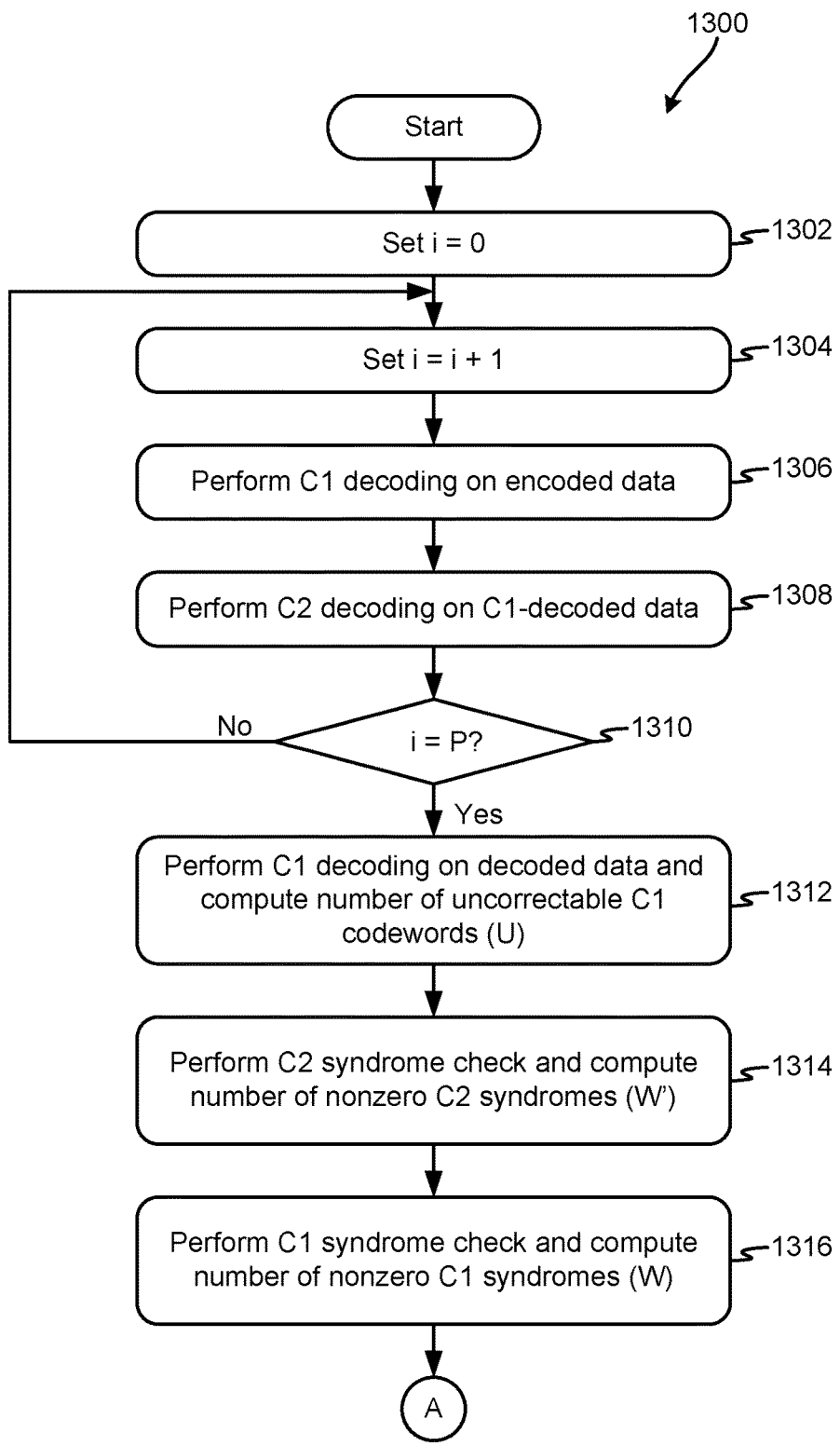
FIG. 13 shows a flowchart of a method, according to one embodiment.

Now referring to FIG. 13, a method 1300 for iterative decoding is shown according to one embodiment. The method 1300 may be performed in accordance with the present invention in any of the environments depicted in FIGS. 1-12, among others, in various embodiments. Of course, more or less operations than those specifically described in FIG. 13 may be included in method 1300, as would be understood by one of skill in the art upon reading the present descriptions.

Each of the steps of the method 1300 may be performed by any suitable component of the operating environment. For example, in various embodiments, the method 1300 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1300. Illustrative processors include, but are not limited to, a CPU, an ASIC, a FPGA, etc., combinations thereof, or any other suitable computing device known in the art.

As shown in FIG. 13, method 1300 may start with operation 1302, where an iteration counter (i) is set to zero (e.g., i=0). This iteration counter is used to track a number of iterations in which decoding is performed on the received encoded data which includes a product codeword.

In operation 1304, the iteration counter is incremented by one (e.g., i=i+1) to denote that another (or a first) iteration of decoding is going to be performed on the data.

In operation 1306, C1 decoding is performed on the encoded data that includes the product codeword to produce C1-decoded data.

In operation 1308, C2 decoding is performed on the C1-decoded data that includes the product codeword to produce decoded data.

In operation 1310, it is determined whether the iteration counter is equal to a predetermined maximum number of full iterations (P) for decoding the product codeword (e.g., i=P). P may be set to accomplish any desired goal and to provide any number of iterations. In streaming mode, P=1, for two iterations of C1/C2 decoding, P=2, etc.

In response to i not equaling P, method 1300 returns to operation 1304 to repeat C1/C2 decoding. In response to i equaling P, method 1300 continues to operation 1312.

In operation 1312, C1 decoding is performed on the decoded data again to produce final decoded data, and the number of uncorrectable C1 codewords (U) is computed.

In operation 1314, a C2 syndrome check is performed on the final decoded data to compute the number of C2 codewords with nonzero syndrome (W') in the product codeword.

In operation 1316, a C1 syndrome check is performed on the final decoded data to compute the number of C1 codewords with nonzero syndrome (W) in the product codeword.

As shown, method 1300 relies on obtaining the parameters U, W', and W in order to determine the error signature. Then, method 1300 continues to A in FIG. 17 to compute the error signature for the decoded product codeword. FIG. 17 will be described after the other embodiments for iterative decoding are described in FIGS. 14-16.

Figure 14:
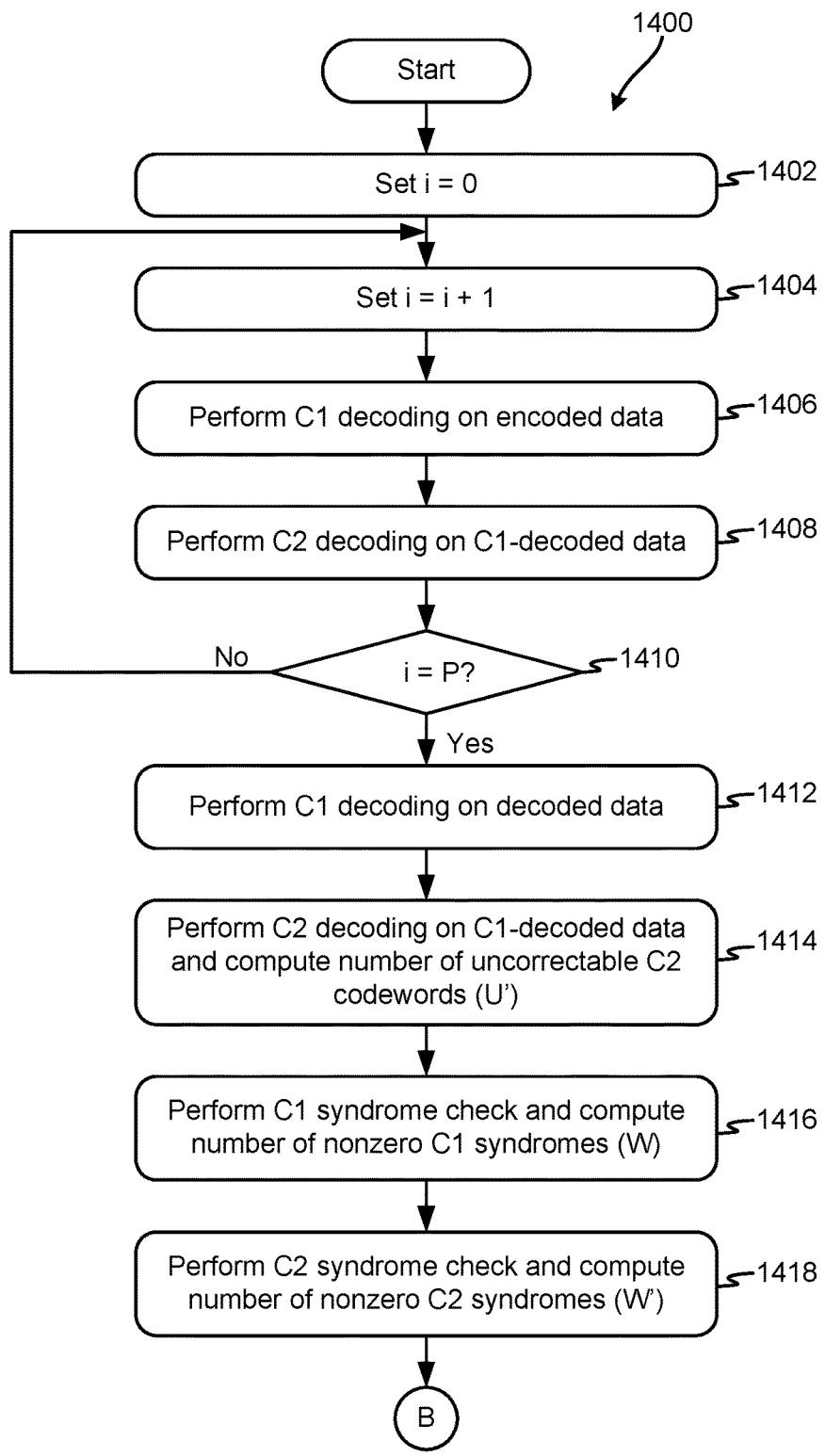
FIG. 14 shows a flowchart of a method, according to one embodiment.

Now referring to FIG. 14, a method 1400 for iterative decoding is shown according to one embodiment. The method 1400 may be performed in accordance with the present invention in any of the environments depicted in FIGS. 1-12, among others, in various embodiments. Of course, more or less operations than those specifically described in FIG. 14 may be included in method 1400, as would be understood by one of skill in the art upon reading the present descriptions.

Each of the steps of the method 1400 may be performed by any suitable component of the operating environment. For example, in various embodiments, the method 1400 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1400. Illustrative processors include, but are not limited to, a CPU, an ASIC, a FPGA, etc., combinations thereof, or any other suitable computing device known in the art.

As shown in FIG. 14, method 1400 may start with operation 1402, where an iteration counter (i) is set to zero (e.g., i=0). This iteration counter is used to track a number of iterations in which decoding is performed on the received encoded data which includes a product codeword.

In operation 1404, the iteration counter is incremented by one (e.g., i=i+1) to denote that another (or a first) iteration of decoding is going to be performed on the data.

In operation 1406, C1 decoding is performed on the encoded data that includes the product codeword to produce C1-decoded data.

In operation 1408, C2 decoding is performed on the C1-decoded data that includes the product codeword to produce decoded data.

In operation 1410, it is determined whether the iteration counter is equal to a predetermined maximum number of full iterations (P) for decoding the product codeword (e.g., i=P). P may be set to accomplish any desired goal and to provide any number of iterations. In streaming mode, P=1, for two iterations of C1/C2 decoding, P=2, etc.

In response to i not equaling P, method 1400 returns to operation 1404 to repeat C1/C2 decoding. In response to i equaling P, method 1400 continues to operation 1412.

In operation 1412, C1 decoding is performed on the decoded data again to produce C1-post-decoded data.

In operation 1414, C2 decoding is performed on the C1-post-decoded data to produce final decoded data. Furthermore, the number of uncorrectable C2 codewords (U') is computed.

In operation 1416, a C1 syndrome check is performed on the final decoded data to compute the number of C1 codewords with nonzero syndrome (W) in the product codeword.

In operation 1418, a C2 syndrome check is performed on the final decoded data to compute the number of C2 codewords with nonzero syndrome (W') in the product codeword.

Figure 17:
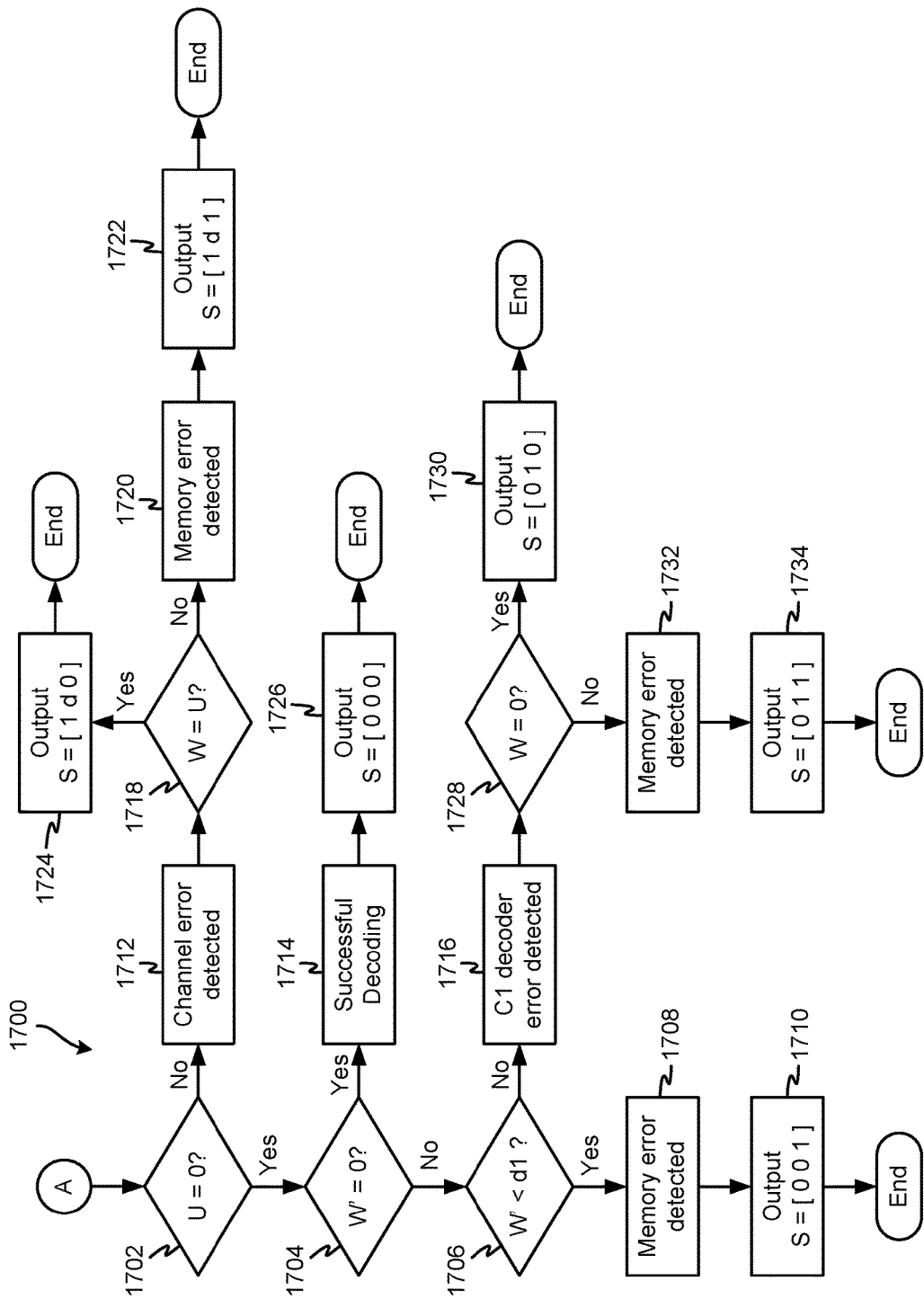
FIG. 17 shows a flowchart of a method, according to one embodiment.
Figure 18:
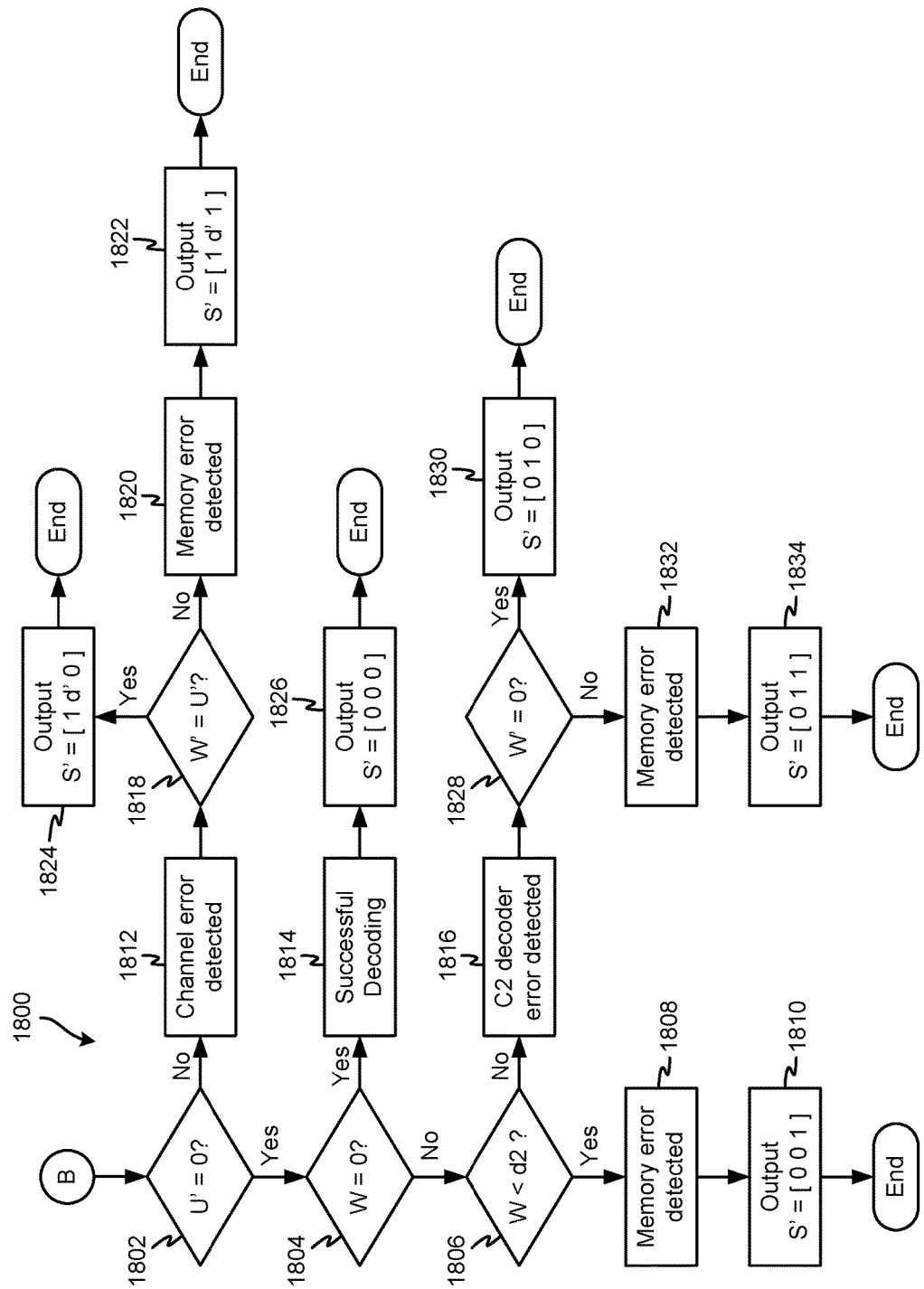
FIG. 18 shows a flowchart of a method, according to one embodiment.

As shown, method 1400 relies on obtaining the parameters U', W', and W in order to determine the error signature. Then, method 1400 continues to B in FIG. 18 to compute the error signature for the decoded product codeword. FIG. 18 will be described after the other embodiment for computing an error signature is described in FIG. 17.

Figure 15:
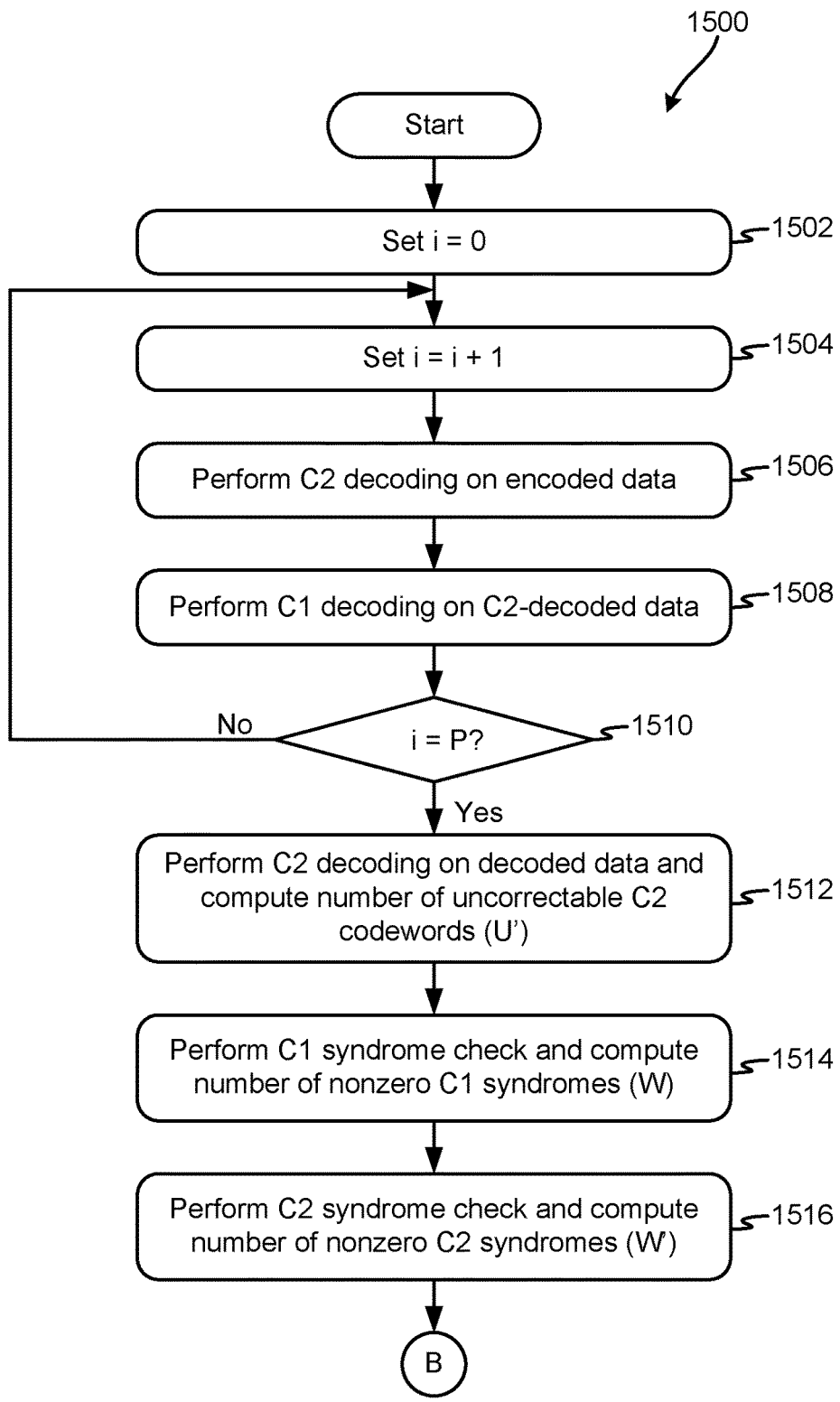
FIG. 15 shows a flowchart of a method, according to one embodiment.

Now referring to FIG. 15, a method 1500 for iterative decoding is shown according to one embodiment. The method 1500 may be performed in accordance with the present invention in any of the environments depicted in FIGS. 1-12, among others, in various embodiments. Of course, more or less operations than those specifically described in FIG. 15 may be included in method 1500, as would be understood by one of skill in the art upon reading the present descriptions.

Each of the steps of the method 1500 may be performed by any suitable component of the operating environment. For example, in various embodiments, the method 1500 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1500. Illustrative processors include, but are not limited to, a CPU, an ASIC, a FPGA, etc., combinations thereof, or any other suitable computing device known in the art.

As shown in FIG. 15, method 1500 may start with operation 1502, where an iteration counter (i) is set to zero (e.g., i=0). This iteration counter is used to track a number of iterations in which decoding is performed on the received encoded data which includes a product codeword.

In operation 1504, the iteration counter is incremented by one (e.g., i=i+1) to denote that another (or a first) iteration of decoding is going to be performed on the data.

In operation 1506, C2 decoding is performed on the encoded data that includes the product codeword to produce C2-decoded data.

In operation 1508, C1 decoding is performed on the C2-decoded data that includes the product codeword to produce decoded data.

In operation 1510, it is determined whether the iteration counter is equal to a predetermined maximum number of full iterations (P) for decoding the product codeword (e.g., i=P). P may be set to accomplish any desired goal and to provide any number of iterations, such as 2 full iterations of C2/C1 decoding, 3 full iterations, 4 full iterations, etc. In streaming mode, P=1, for two iterations of C2/C1 decoding, P=2, etc.

In response to i not equaling P, method 1500 returns to operation 1504 to repeat C2/C1 decoding. In response to i equaling P, method 1500 continues to operation 1512.

In operation 1512, C2 decoding is performed on the decoded data again to produce final decoded data and the number of uncorrectable C2 codewords (U') in the decoded data is computed.

In operation 1514, a C1 syndrome check is performed on the final decoded data to compute the number of C1 codewords with nonzero syndrome (W) in the product codeword.

In operation 1516, a C2 syndrome check is performed on the final decoded data to compute the number of C2 codewords with nonzero syndrome (W') in the product codeword.

As shown, method 1500 relies on obtaining the parameters U', W', and W in order to determine the error signature. Then, method 1500 continues to B in FIG. 18 to compute the error signature for the decoded product codeword.

Figure 16:
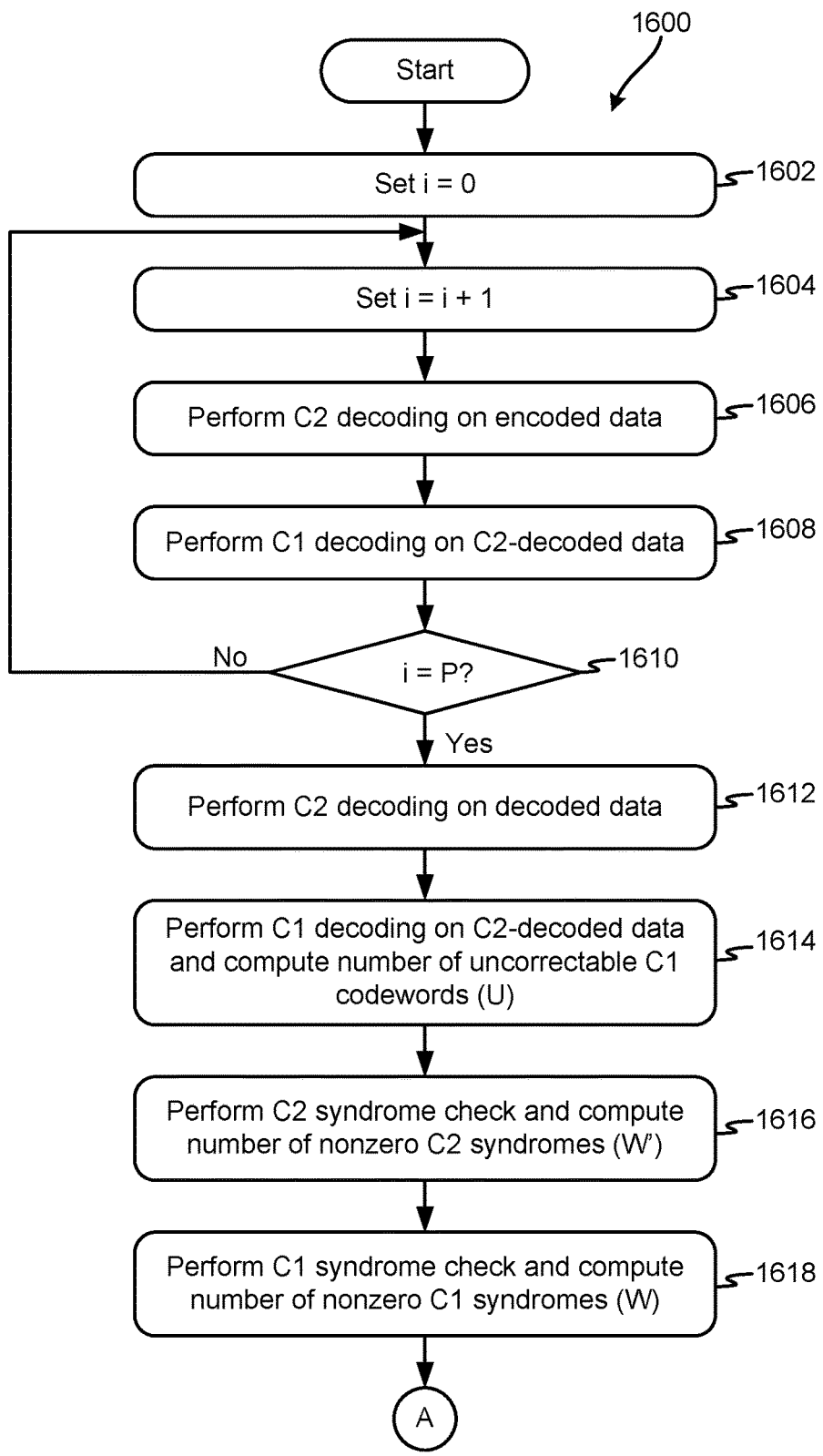
FIG. 16 shows a flowchart of a method, according to one embodiment.

Now referring to FIG. 16, a method 1600 for iterative decoding is shown according to one embodiment. The method 1600 may be performed in accordance with the present invention in any of the environments depicted in FIGS. 1-12, among others, in various embodiments. Of course, more or less operations than those specifically described in FIG. 16 may be included in method 1600, as would be understood by one of skill in the art upon reading the present descriptions.

Each of the steps of the method 1600 may be performed by any suitable component of the operating environment. For example, in various embodiments, the method 1600 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1600. Illustrative processors include, but are not limited to, a CPU, an ASIC, a FPGA, etc., combinations thereof, or any other suitable computing device known in the art.

As shown in FIG. 16, method 1600 may start with operation 1602, where an iteration counter (i) is set to zero (e.g., i=0). This iteration counter is used to track a number of iterations in which decoding is performed on the received encoded data which includes a product codeword.

In operation 1604, the iteration counter is incremented by one (e.g., i=i+1) to denote that another (or a first) iteration of decoding is going to be performed on the data.

In operation 1606, C2 decoding is performed on the encoded data that includes the product codeword to produce C2-decoded data.

In operation 1608, C1 decoding is performed on the C2-decoded data that includes the product codeword to produce decoded data.

In operation 1610, it is determined whether the iteration counter is equal to a predetermined maximum number of full iterations (P) for decoding the product codeword (e.g., i=P). P may be set to accomplish any desired goal and to provide any number of iterations. In streaming mode, P=1, for two iterations of C2/C1 decoding, P=2, etc.

In response to i not equaling P, method 1600 returns to operation 1604 to repeat C2/C1 decoding. In response to i equaling P, method 1600 continues to operation 1612.

In operation 1612, C2 decoding is performed on the decoded data to produce C2-post-decoded data.

In operation 1614, C1 decoding is performed on the C2-post-decoded data to produce final decoded data. Also, the number of uncorrectable C1 codewords (U) in the final decoded data is computed.

In operation 1616, a C2 syndrome check is performed on the final decoded data to compute the number of C2 codewords with nonzero syndrome (W') in the product codeword.

In operation 1618, a C1 syndrome check is performed on the final decoded data to compute the number of C1 codewords with nonzero syndrome (W) in the product codeword.

As shown, method 1600 relies on obtaining the parameters U, W', and W in order to determine the error signature. Then, method 1600 continues to A in FIG. 17 to compute the error signature for the decoded product codeword.

Now referring to FIG. 17, a method 1700 is shown, according to one embodiment, which may be performed after either of the methods depicted in FIGS. 13 and 16. Referring again to FIG. 17, the method 1700 may be performed in accordance with the present invention in any of the environments depicted in FIGS. 1-12, among others, in various embodiments. Of course, more or less operations than those specifically described in FIG. 17 may be included in method 1700, as would be understood by one of skill in the art upon reading the present descriptions.

Each of the steps of the method 1700 may be performed by any suitable component of the operating environment. For example, in various embodiments, the method 1700 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1700. Illustrative processors include, but are not limited to, a CPU, an ASIC, a FPGA, etc., combinations thereof, or any other suitable computing device known in the art.

As shown in FIG. 17, method 1700 starts from the A connection from a previously performed iterative decoding method with operation 1702, where it is determined whether the number of uncorrectable C1 codewords (U) is equal to zero (e.g., U=0). In response to U equaling zero, method 1700 continues to operation 1704; otherwise, method 1700 moves to operation 1712.

In operation 1704, it is determined whether the number of C2 codewords with nonzero syndrome in the product codeword (illegal C2 codewords) that are detected after checking C2 syndrome is equal to zero (e.g., W'=0). In response to W' equaling zero, method 1700 moves to operation 1714; otherwise, method 1700 continues to operation 1706.

In operation 1706, it is determined whether the number of C2 codewords with nonzero syndrome in the product codeword (illegal C2 codewords) that are detected after checking C2 syndrome is less than the minimum Hamming distance (d1) for the C1 code (e.g., W'<d1). In response to W' being less than d1, method 1700 continues to operation 1708; otherwise, method 1700 moves to operation 1716.

In operation 1708, a memory error is detected in response to W'<d1, and in operation 1710, the error signature of S=[0 0 1] is output.

In operation 1712, a channel error is detected in response to U≠0, and method 1700 continues to operation 1718.

In operation 1714, it is determined that decoding has been successful, and method 1700 continues to operation 1726.

In operation 1716, a C1 decoder error is detected in response to W'≥d1, and method 1700 continues to operation 1728.

In operation 1718, it is determined whether the number of C1 codewords with nonzero syndrome (W) in the product codeword (illegal C1 codewords) that are detected after checking C2 syndrome is equal to the number of uncorrectable C1 codewords (U) (e.g., W=U). In response to W equaling U, method 1700 moves to operation 1724; otherwise, method 1700 continues to operation 1720.

In operation 1720, a memory error is detected in response to W≠U and U≠0, and in operation 1722, the error signature of S=[1 d 1] is output, where d is based on the value of D, where d=0 when D=0, and d=1 when D>0.

In operation 1724, the error signature of S=[1 d 0] is output, where d is based on the value of D, where d=0 when D=0, and d=1 when D>0.

In operation 1726, the error signature of S=[0 0 0] is output in response to successful decoding of all codewords in the product codeword.

In operation 1728, it is determined whether the number of C1 codewords with nonzero syndrome (W) in the product codeword (illegal C1 codewords) that are detected after checking C2 syndrome is equal to zero (e.g., W=0). In response to W equaling 0, method 1700 moves to operation 1730; otherwise, method 1700 continues to operation 1732.

In operation 1730, the error signature of S=[0 1 0] is output.

In operation 1732, a memory error is detected in response to W'≥d1 and W≠0, and in operation 1734, the error signature of S=[0 1 1] is output.

According to one embodiment, after an error signature is obtained in method 1700, one or more actions may be performed to rectify the particular type of error that is identified by the error signature prior to re-reading the encoded data from the medium, and/or attempting iterative decoding again. These actions may include adjustment of the medium's physical position laterally relative to the read sensor(s), movement of the medium forward or backward in respect to the read sensor(s), usage of more or less intensive decoding algorithm(s) to decode the encoded data, use of one or more different decoding algorithm(s) to decode the encoded data, increase or decrease in number of iterations in the decoding scheme, increase or decrease in speed of movement of the medium during re-reading, etc.

Now referring to FIG. 18, a method 1800 is shown, according to one embodiment, which may be performed after either of the methods depicted in FIGS. 14 and 15. Referring again to FIG. 18, the method 1800 may be performed in accordance with the present invention in any of the environments depicted in FIGS. 1-12, among others, in various embodiments. Of course, more or less operations than those specifically described in FIG. 18 may be included in method 1800, as would be understood by one of skill in the art upon reading the present descriptions.

Each of the steps of the method 1800 may be performed by any suitable component of the operating environment. For example, in various embodiments, the method 1800 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1800. Illustrative processors include, but are not limited to, a CPU, an ASIC, a FPGA, etc., combinations thereof, or any other suitable computing device known in the art.

As shown in FIG. 18, method 1800 starts from the B connection from a previously performed iterative decoding method with operation 1802, where it is determined whether the number of uncorrectable C2 codewords (U') is equal to zero (e.g., U'=0). In response to U' equaling zero, method 1800 continues to operation 1804; otherwise, method 1800 moves to operation 1812.

In operation 1804, it is determined whether the number of C1 codewords with nonzero syndrome in the product codeword (illegal C1 codewords) that are detected after checking C1 syndrome is equal to zero (e.g., W=0). In response to W equaling zero, method 1800 moves to operation 1814; otherwise, method 1800 continues to operation 1806.

In operation 1806, it is determined whether the number of C1 codewords with nonzero syndrome in the product codeword (illegal C1 codewords) that are detected after checking C1 syndrome is less than the minimum Hamming distance (d2) for the C2 code (e.g., W<d2). In response to W being less than d2, method 1800 continues to operation 1808; otherwise, method 1800 moves to operation 1816.

In operation 1808, a memory error is detected in response to W<d2, and in operation 1810, the error signature of S'=[0 0 1] is output.

In operation 1812, a channel error is detected in response to U'≠0, and method 1800 continues to operation 1818.

In operation 1814, it is determined that decoding has been successful, and method 1800 continues to operation 1826.

In operation 1816, a C2 decoder error is detected in response to W≥d2, and method 1800 continues to operation 1828.

In operation 1818, it is determined whether the number of C2 codewords with nonzero syndrome (W') in the product codeword (illegal C2 codewords) that are detected after checking C2 syndrome is equal to the number of uncorrectable C2 codewords (U') (e.g., W'=U'). In response to W' equaling U', method 1800 moves to operation 1824; otherwise, method 1800 continues to operation 1820.

In operation 1820, a memory error is detected in response to W'≠U' and U'≠0, and in operation 1822, the error signature of S'=[1 d' 1] is output, where d' is based on the value of D', where d'=0 when D'=0, and d'=1 when D'>0.

In operation 1824, the error signature of S'=[1 d' 0] is output, where d' is based on the value of D', where d'=0 when D'=0, and d'=1 when D'>0.

In operation 1826, the error signature of S'=[0 0 0] is output in response to successful decoding of all codewords in the product codeword.

In operation 1828, it is determined whether the number of C2 codewords with nonzero syndrome (W') in the product codeword (illegal C2 codewords) that are detected after checking C2 syndrome is equal to zero (e.g., W'=0). In response to W' equaling 0, method 1800 moves to operation 1830; otherwise, method 1800 continues to operation 1832.

In operation 1830, the error signature of S'=[0 1 0] is output.

In operation 1832, a memory error is detected in response to W<d2 and W'≠0, and in operation 1834, the error signature of S'=[0 1 1] is output.

According to one embodiment, after an error signature is obtained in method 1800, one or more actions may be performed to rectify the particular type of error that is identified by the error signature prior to re-reading the encoded data from the medium, and/or attempting iterative decoding again. These actions may include adjustment of the medium's physical position laterally relative to the read sensor(s), movement of the medium forward or backward in respect to the read sensor(s), usage of more or less intensive decoding algorithm(s) to decode the encoded data, use of one or more different decoding algorithm(s) to decode the encoded data, increase or decrease in number of iterations in the decoding scheme, increase or decrease in speed of movement of the medium during re-reading, etc.

Figure 19:
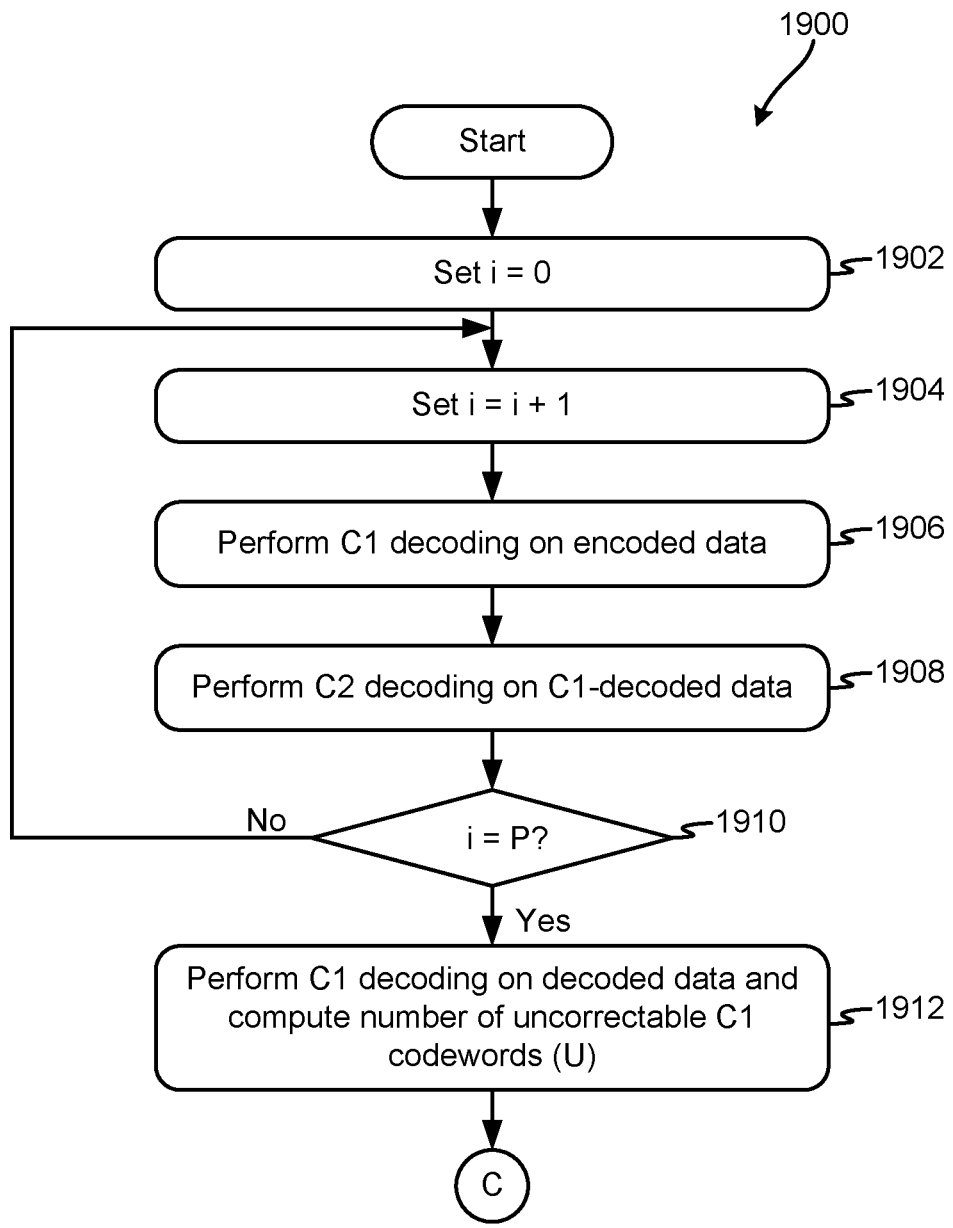
FIG. 19 shows a flowchart of a method, according to one embodiment.

Now referring to FIG. 19, a method 1900 for iterative decoding is shown according to one embodiment. The method 1900 may be performed in accordance with the present invention in any of the environments depicted in FIGS. 1-12, among others, in various embodiments. Of course, more or less operations than those specifically described in FIG. 19 may be included in method 1900, as would be understood by one of skill in the art upon reading the present descriptions.

Each of the steps of the method 1900 may be performed by any suitable component of the operating environment. For example, in various embodiments, the method 1900 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1900. Illustrative processors include, but are not limited to, a CPU, an ASIC, a FPGA, etc., combinations thereof, or any other suitable computing device known in the art.

As shown in FIG. 19, method 1900 may start with operation 1902, where an iteration counter (i) is set to zero (e.g., i=0). This iteration counter is used to track a number of iterations in which decoding is performed on the received encoded data which includes a product codeword.

In operation 1904, the iteration counter is incremented by one (e.g., i=i+1) to denote that another (or a first) iteration of decoding is going to be performed on the data.

In operation 1906, C1 decoding is performed on the encoded data that includes the product codeword to produce C1-decoded data.

In operation 1908, C2 decoding is performed on the C1-decoded data that includes the product codeword to produce decoded data.

In operation 1910, it is determined whether the iteration counter is equal to a predetermined maximum number of full iterations (P) for decoding the product codeword (e.g., i=P). P may be set to accomplish any desired goal and to provide any number of iterations. In streaming mode, P=1, for two iterations of C1/C2 decoding, P=2, etc.

In response to i not equaling P, method 1900 returns to operation 1904 to repeat C1/C2 decoding. In response to i equaling P, method 1900 continues to operation 1912.

In operation 1912, C1 decoding is performed on the decoded data again to produce final decoded data, and the number of uncorrectable C1 codewords (U) in the product codeword is computed.

Figure 20:
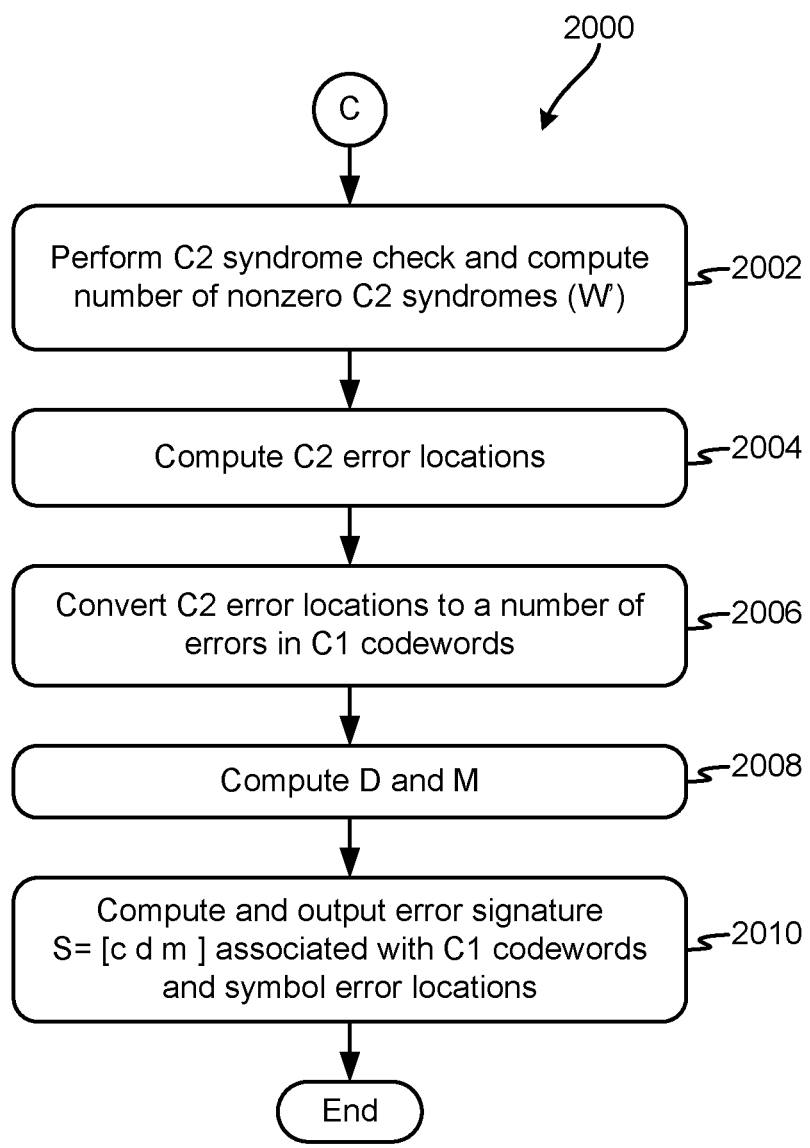
FIG. 20 shows a flowchart of a method, according to one embodiment.

Then, method 1900 continues to C in FIG. 20 to compute the error signature for the decoded product codeword.

Now referring to FIG. 20, a method 2000 is shown according to one embodiment. The method 2000 may be performed in accordance with the present invention in any of the environments depicted in FIGS. 1-12, among others, in various embodiments. Of course, more or less operations than those specifically described in FIG. 20 may be included in method 2000, as would be understood by one of skill in the art upon reading the present descriptions.

Each of the steps of the method 2000 may be performed by any suitable component of the operating environment. For example, in various embodiments, the method 2000 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2000. Illustrative processors include, but are not limited to, a CPU, an ASIC, a FPGA, etc., combinations thereof, or any other suitable computing device known in the art.

As shown in FIG. 20, method 2000 may start with operation 2002, where a C2 syndrome check is performed on the final decoded data, to compute a number of nonzero C2 syndromes (illegal C2 codewords), referred to as W'.

In operation 2004, C2 error locations are computed based on the illegal C2 codewords and other information obtained during decoding.

In operation 2006, C2 error locations are converted to C1 error locations. Because C1 and C2 codewords are orthogonal in the product codeword, the location of an error in a C2 codeword may be converted to a location of an error in a C1 codeword, and vice versa.

In operation 2008, a number of C1 codewords that have at least d1 symbol errors (D), other than uncorrectable C1 codewords (U), is computed. Also, a number of C1 codewords that have less than d1 symbol errors (M), other than uncorrectable C1 codewords (U), is computed. Both of these values, D and M, are computed after C2 error locations are determined.

In operation 2010, c, d, and m are computed based on the relationships previously described, and the corresponding error signature is output S=[c d m].

According to one embodiment, after an error signature is obtained in method 2000, one or more actions may be performed to rectify the particular type of error that is identified by the error signature prior to re-reading the encoded data from the medium, and/or attempting iterative decoding again. These actions may include adjustment of the medium's physical position laterally relative to the read sensor(s), movement of the medium forward or backward in respect to the read sensor(s), usage of more or less intensive decoding algorithm(s) to decode the encoded data, use of one or more different decoding algorithm(s) to decode the encoded data, increase or decrease in number of iterations in the decoding scheme, increase or decrease in speed of movement of the medium during re-reading, etc.

Method 2000 is an error signature calculation which relies on the determination of U, and the computation of D and M, after C1/C2 iterative decoding that ends with C1 decoding as a last decoding operation, such as the method 1900 shown in FIG. 19 as an example.

Figure 21:
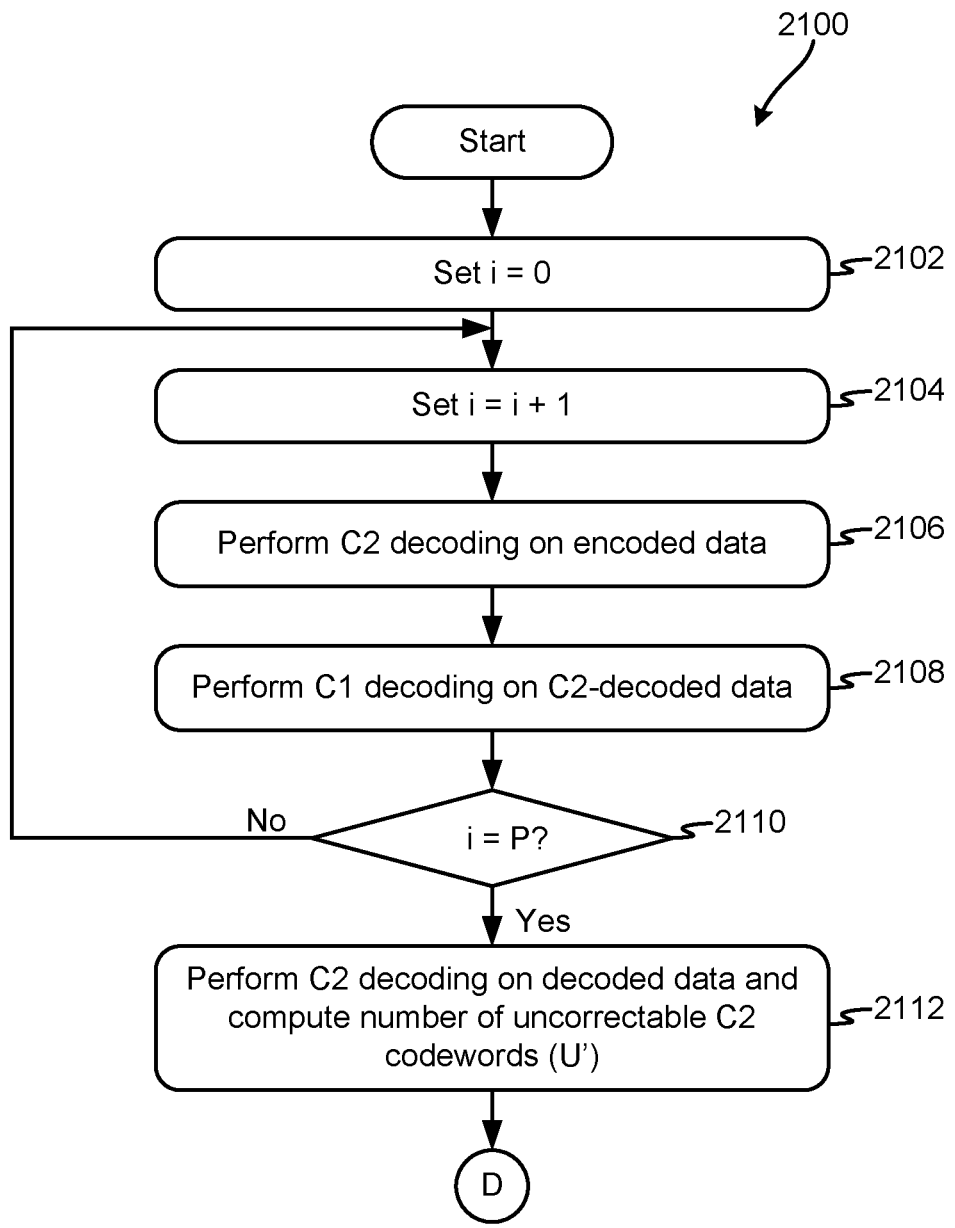
FIG. 21 shows a flowchart of a method, according to one embodiment.

Now referring to FIG. 21, a method 2100 is shown according to one embodiment. The method 2100 may be performed in accordance with the present invention in any of the environments depicted in FIGS. 1-12, among others, in various embodiments. Of course, more or less operations than those specifically described in FIG. 21 may be included in method 2100, as would be understood by one of skill in the art upon reading the present descriptions.

Each of the steps of the method 2100 may be performed by any suitable component of the operating environment. For example, in various embodiments, the method 2100 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2100. Illustrative processors include, but are not limited to, a CPU, an ASIC, a FPGA, etc., combinations thereof, or any other suitable computing device known in the art.

As shown in FIG. 21, method 2100 may start with operation 2102, where an iteration counter (i) is set to zero (e.g., i=0). This iteration counter is used to track a number of iterations in which decoding is performed on the received encoded data which includes a product codeword.

In operation 2104, the iteration counter is incremented by one (e.g., i=i+1) to denote that another (or a first) iteration of decoding is going to be performed on the data.

In operation 2106, C2 decoding is performed on the encoded data that includes the product codeword to produce C2-decoded data.

In operation 2108, C1 decoding is performed on the C2-decoded data that includes the product codeword to produce decoded data.

In operation 2110, it is determined whether the iteration counter is equal to a predetermined maximum number of full iterations (P) for decoding the product codeword (e.g., i=P). P may be set to accomplish any desired goal and to provide any number of iterations. In streaming mode, P=1, for two iterations of C2/C1 decoding, P=2, etc.

In response to i not equaling P, method 2100 returns to operation 2104 to repeat C2/C1 decoding. In response to i equaling P, method 2100 continues to operation 2112.

In operation 2112, C2 decoding is performed on the decoded data again to produce final decoded data. Then, method 2100 continues to D in FIG. 22 to compute the error signature for the decoded product codeword.

Figure 22:
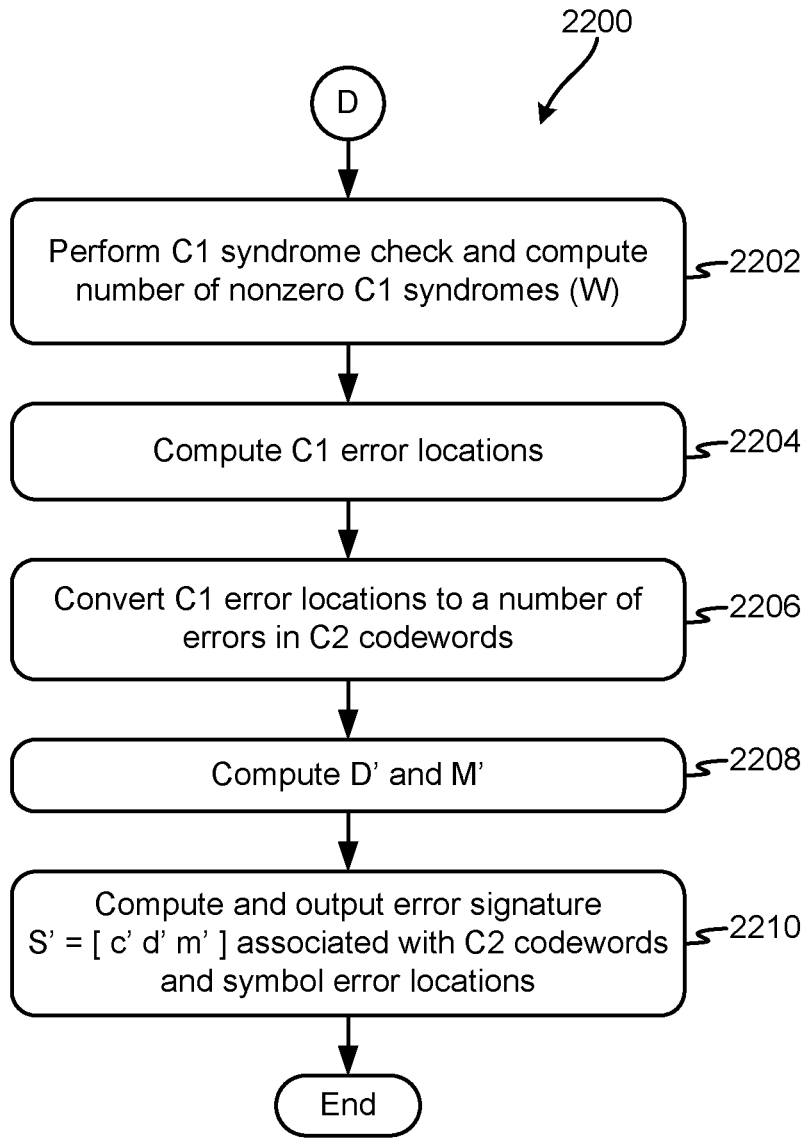
FIG. 22 shows a flowchart of a method, according to one embodiment.

Now referring to FIG. 22, a method 2200 is shown according to one embodiment. The method 2200 may be performed in accordance with the present invention in any of the environments depicted in FIGS. 1-12, among others, in various embodiments. Of course, more or less operations than those specifically described in FIG. 22 may be included in method 2200, as would be understood by one of skill in the art upon reading the present descriptions.

Each of the steps of the method 2200 may be performed by any suitable component of the operating environment. For example, in various embodiments, the method 2200 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2200. Illustrative processors include, but are not limited to, a CPU, an ASIC, a FPGA, etc., combinations thereof, or any other suitable computing device known in the art.

As shown in FIG. 22, method 2200 may start with operation 2202, where a C1 syndrome check is performed on the final decoded data, to compute a number of nonzero C1 syndromes (illegal C1 codewords), referred to as W.

In operation 2204, C1 error locations are computed based on the illegal C1 codewords and other information obtained during decoding.

In operation 2206, C1 error locations are converted to C2 error locations. Because C1 and C2 codewords are orthogonal in the product codeword, the location of an error in a C1 codeword may be converted to a location of an error in a C2 codeword, and vice versa.

In operation 2208, a number of C2 codewords that have at least d2 symbol errors (D'), other than uncorrectable C2 codewords (U'), is computed. Also, a number of C2 codewords that have less than d2 symbol errors (M'), other than uncorrectable C2 codewords (U'), is computed. Both of these values, D' and M', are computed after C1 error locations are determined.

In operation 2210, c', d', and m' are computed based on the relationships previously described, and the corresponding error signature is output S'=[c' d' m'].

According to one embodiment, after an error signature is obtained in method 2200, one or more actions may be performed to rectify the particular type of error that is identified by the error signature prior to re-reading the encoded data from the medium, and/or attempting iterative decoding again. These actions may include adjustment of the medium's physical position laterally relative to the read sensor(s), movement of the medium forward or backward in respect to the read sensor(s), usage of more or less intensive decoding algorithm(s) to decode the encoded data, use of one or more different decoding algorithm(s) to decode the encoded data, increase or decrease in number of iterations in the decoding scheme, increase or decrease in speed of movement of the medium during re-reading, etc.

Method 2200 is an error signature calculation which relies on the determination of U', and the computation of D' and M', after C2/C1 iterative decoding that ends with a C2 decoding operation as a last decoding operation.

In one embodiment, the error correction status for the C1 and C2 decoders and the C1 and C2 syndrome checkers may be used to identify whether an error is due to a soft failure in memory, is a mis-correction by either the C1 decoder or the C2 decoder, or is an uncorrectable error. Table 3 shows the relationships between the decoder status, syndrome checker status, and what type of error is present, according to one embodiment.

TABLE 3

Relationships for Error Types

| Last Decoder 0 = C1, 1 = C2 | Last Status 1 = UE | C1 CHK Error 1 = Err | C2 CHK Error 1 = Err | C1 Mis-Correction | C2 Mis-Correction | Memory Error | Data Good? 1 = good |
|---|---|---|---|---|---|---|---|
| 0 | 0 | 0 | 0 | 0 | 0 | 0 | 1 |
| 0 | 0 | 0 | 1 | 1 | 0 | 0 | 0 |
| 0 | 0 | 1 | 0 | 0 | 0 | 1 | 0 |
| 0 | 0 | 1 | 1 | 0 | 0 | 1 | 0 |
| 0 | 1 | 0 | 0 | 0 | 0 | 0 | 0 |
| 0 | 1 | 0 | 1 | 0 | 0 | 0 | 0 |
| 0 | 1 | 1 | 0 | 0 | 0 | 0 | 0 |
| 0 | 1 | 1 | 1 | 0 | 0 | 0 | 0 |
| 1 | 0 | 0 | 0 | 0 | 0 | 0 | 1 |
| 1 | 0 | 0 | 1 | 0 | 0 | 1 | 0 |
| 1 | 0 | 1 | 0 | 0 | 1 | 0 | 0 |
| 1 | 0 | 1 | 1 | 0 | 0 | 1 | 0 |
| 1 | 1 | 0 | 0 | 0 | 0 | 0 | 0 |
| 1 | 1 | 0 | 1 | 0 | 0 | 0 | 0 |
| 1 | 1 | 1 | 0 | 0 | 0 | 0 | 0 |
| 1 | 1 | 1 | 1 | 0 | 0 | 0 | 0 |

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic, software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
 a controller and logic integrated with the controller, executable by the controller, or integrated with and executable by the controller, the logic being configured to:
  perform iterative decoding on encoded data to obtain decoded data; and
  perform post-decoding error diagnostics on a first portion of the decoded data in response to not obtaining a valid product codeword in the first portion after the iterative decoding of the encoded data.

2. The system as recited in claim 1, wherein at least three decoding operations are performed in the iterative decoding.

3. The system as recited in claim 1, wherein the decoding comprises initial C1 decoding followed by C2 decoding followed by C1 decoding again.

4. The system as recited in claim 1, wherein the decoding comprises initial C2 decoding followed by C1 decoding followed by C2 decoding again.

5. The system as recited in claim 1, wherein the logic configured to perform post-decoding error diagnostics on the decoded data is further configured to identify an error signature in the decoded data for identifying the type of error that remains after decoding the encoded data; and comprising performing an action to rectify the particular type of error that is identified by the error signature.

6. A controller-implemented method, the method comprising:
 performing iterative decoding on encoded data to obtain decoded data; and
 performing post-decoding error diagnostics on a first portion of the decoded data in response to not obtaining a valid product codeword in the first portion after the iterative decoding of the encoded data.

7. The method as recited in claim 6, wherein at least three decoding operations are performed in the iterative decoding.

8. The method as recited in claim 6, comprising outputting a second portion of the decoded data in response to obtaining a valid product codeword in the second portion after at least one decoding operation in the iterative decoding of the encoded data.

9. The method as recited in claim 6, wherein the decoding comprises initial C1 decoding followed by C2 decoding followed by C1 decoding again.

10. The method as recited in claim 6, wherein the decoding comprises initial C2 decoding followed by C1 decoding followed by C2 decoding again.

11. The method as recited in claim 6, wherein the performing post-decoding error diagnostics on the decoded data comprises identifying an error signature in the decoded data for identifying the types of errors that remain after decoding the encoded data.

12. The method as recited in claim 11, wherein the identifying an error signature in the decoded data comprises:
 obtaining a number of uncorrectable C1 codewords (U) in the decoded data;
 obtaining a number of C2 codewords with nonzero syndrome (W') in the decoded data;
 obtaining a number of C1 codewords with nonzero syndrome (W) in the decoded data;
 obtaining a number of C1 codewords (D) in the decoded data that have at least a threshold (d1) of symbol errors detected therein excluding the number of uncorrectable C1 codewords (U); and
 obtaining a number of C1 codewords (M) in the decoded data that have less than the threshold (d1) of symbol errors detected therein excluding the number of uncorrectable C1 codewords (U).

13. A computer program product, the computer program product comprising a computer readable storage medium having program instructions embodied therewith, wherein the computer readable storage medium is not a transitory signal per se, the embodied program instructions being executable by a controller to cause the controller to perform a method comprising:
 performing, by the controller, iterative decoding on encoded data to obtain decoded data; and
 performing, by the controller, post-decoding error diagnostics on a first portion of the decoded data in response to not obtaining a valid product codeword in the first portion after the iterative decoding of the encoded data.

14. The computer program product as recited in claim 13, wherein at least three decoding operations are performed in the iterative decoding.

15. The computer program product as recited in claim 13, wherein the embodied program instructions are further executable by the controller to cause the controller to:
output, by the controller, a second portion of the decoded data in response to obtaining a valid product codeword in the second portion after at least one decoding operation in the iterative decoding of the encoded data.

16. The computer program product as recited in claim 13, wherein the decoding comprises initial C1 decoding followed by C2 decoding followed by C1 decoding again.

17. The computer program product as recited in claim 13, wherein the decoding comprises initial C2 decoding followed by C1 decoding followed by C2 decoding again.

18. The computer program product as recited in claim 13, wherein the embodied program instructions executable by the controller to cause the controller to perform post-decoding error diagnostics on the decoded data further cause the controller to identify an error signature in the decoded data.

19. The computer program product as recited in claim 18, wherein the embodied program instructions executable by the controller to cause the controller to identify the error signature in the decoded data further cause the controller to:
obtain a number of uncorrectable C1 codewords (U) in the decoded data;
obtain a number of C2 codewords with nonzero syndrome (W') in the decoded data;
obtain a number of C1 codewords with nonzero syndrome (W) in the decoded data;
obtain a number of C1 codewords (D) in the decoded data that have at least a threshold (d1) of symbol errors detected therein excluding the number of uncorrectable C1 codewords (U); and
obtain a number of C1 codewords (M) in the decoded data that have less than the threshold (d1) of symbol errors detected therein excluding the number of uncorrectable C1 codewords (U).

20. The computer program product as recited in claim 19, wherein the embodied program instructions are further executable by the controller to cause the controller to define eight error signatures for the decoded data: a first error signature representing no error types being discovered in the decoded data, a second error signature representing at least one memory error (M>0) being discovered in the decoded data, a third error signature representing at least one decoder error (D>0) being discovered in the decoded data, a fourth error signature representing at least one decoder error (D>0) and at least one memory error (M>0) being discovered in the decoded data, a fifth error signature representing at least one channel error (U>0) being discovered in the decoded data, a sixth error signature representing at least one channel error (U>0) and at least one memory error (M>0) being discovered in the decoded data, a seventh error signature representing at least one channel error (U>0) and at least one decoder error (D>0) being discovered in the decoded data, and an eighth error signature representing at least one channel error (U>0), at least one decoder error (D>0), and at least one memory error (M>0) being discovered in the decoded data.

* * * * *